United States Patent
Branz et al.

(10) Patent No.: US 8,466,447 B2
(45) Date of Patent: Jun. 18, 2013

(54) BACK CONTACT TO FILM SILICON ON METAL FOR PHOTOVOLTAIC CELLS

(75) Inventors: Howard M. Branz, Golden, CO (US); Charles Teplin, Golden, CO (US); Pauls Stradins, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 676 days.

(21) Appl. No.: 12/537,152

(22) Filed: Aug. 6, 2009

(65) Prior Publication Data
US 2013/0048065 A1  Feb. 28, 2013

(51) Int. Cl.
*H01L 31/042* (2006.01)

(52) U.S. Cl.
USPC ................ 257/9; 257/E21.211; 257/E31.041

(58) Field of Classification Search
USPC ............................ 257/9, E21.211, E31.041
See application file for complete search history.

(56) References Cited

U.S. PATENT DOCUMENTS

| | | | |
|---|---|---|---|
| 4,530,739 A | 7/1985 | Hanak et al. |
| 4,663,828 A | 5/1987 | Hanak |
| 4,727,047 A | 2/1988 | Bozler et al. |
| 5,221,854 A | 6/1993 | Banerjee et al. |
| 5,317,236 A | 5/1994 | Zavracky et al. |
| 5,356,488 A | 10/1994 | Hezel |
| 6,184,057 B1 | 2/2001 | Van Andel et al. |
| 6,350,945 B1 | 2/2002 | Mizuno |
| 6,451,450 B1 | 9/2002 | Goyal et al. |
| 6,555,256 B1 | 4/2003 | Christen et al. |
| 6,613,598 B1 | 9/2003 | Middelman et al. |
| 6,872,988 B1 | 3/2005 | Goyal |
| 7,144,751 B2 | 12/2006 | Gee et al. |
| 7,170,001 B2 | 1/2007 | Gee et al. |
| 7,261,776 B2 | 8/2007 | Rupich et al. |
| 7,276,658 B2 | 10/2007 | Dubbeldam |
| 7,288,332 B2 | 10/2007 | Findikoglu et al. |
| 7,339,110 B1 | 3/2008 | Mulligan et al. |
| 7,777,954 B2 | 8/2010 | Gruhike et al. |

(Continued)

FOREIGN PATENT DOCUMENTS

| | | |
|---|---|---|
| JP | 55143706 | 11/1980 |
| WO | 2009096931 | 8/2009 |
| WO | 2010093364 | 8/2010 |

OTHER PUBLICATIONS

Findikoglu, Alp T. et al., Well-Oriented Silicon Thin Films with High Carrier Mobility on Polycrystalline Substrates, Advanced Materials, 2005, 1527-1531, 17, Wiley-VCH Verlag GmbH & Co. KGaA, Weinheim.

(Continued)

*Primary Examiner* — Colleen Matthews
(74) *Attorney, Agent, or Firm* — J. Patrick Kendrick; Paul J. White; John C. Stolpa

(57) ABSTRACT

A crystal oriented metal back contact for solar cells is disclosed herein. In one embodiment, a photovoltaic device and methods for making the photovoltaic device are disclosed. The photovoltaic device includes a metal substrate with a crystalline orientation and a heteroepitaxial crystal silicon layer having the same crystal orientation of the metal substrate. A heteroepitaxial buffer layer having the crystal orientation of the metal substrate is positioned between the substrate and the crystal silicon layer to reduce diffusion of metal from the metal foil into the crystal silicon layer and provide chemical compatibility with the heteroepitaxial crystal silicon layer. Additionally, the buffer layer includes one or more electrically conductive pathways to electrically couple the crystal silicon layer and the metal substrate.

13 Claims, 25 Drawing Sheets

U.S. PATENT DOCUMENTS

| | | |
|---|---|---|
| 8,048,250 B2 | 11/2011 | Raymond et al. |
| 2001/0037823 A1 | 11/2001 | Middelman et al. |
| 2004/0261834 A1 | 12/2004 | Basore et al. |
| 2006/0002656 A1 | 1/2006 | Cowan et al. |
| 2006/0115964 A1 | 6/2006 | Findikoglu et al. |
| 2006/0208257 A1 | 9/2006 | Branz et al. |
| 2007/0044832 A1 | 3/2007 | Fritzemeier |
| 2007/0246802 A1 | 10/2007 | Xianyu et al. |
| 2008/0217622 A1 | 9/2008 | Goyal |
| 2008/0230779 A1 | 9/2008 | Goyal |
| 2009/0114274 A1 | 5/2009 | Fritzemeier |
| 2009/0117679 A1 | 5/2009 | Fritzemeier |
| 2009/0178704 A1 | 7/2009 | Kalejs et al. |
| 2009/0297774 A1 | 12/2009 | Chaudhari |
| 2010/0313943 A1 | 12/2010 | Knoll et al. |
| 2011/0017298 A1 | 1/2011 | Lee |
| 2011/0062446 A1 | 3/2011 | Goyal |
| 2011/0284061 A1 | 11/2011 | Vanecek et al. |

OTHER PUBLICATIONS

Goyal, A., "The RABoTS Approach: Using Rolling-Assisted Biaxially Textured Substrates for Hight-Performance YBCO Superconductors," MRS Bulletin, p. 553 (Aug. 2004).

Xiang, H.J. et al., "Atomic and electronic structures of the Si/AI203 heterointerface without dangling bonds: a first-principles study," National Renewable Energy Laboratory, Golden, Colorado, Jan. 21, 2009.

Hane, S., "Film-Silicon PV: Optimizing silicon in solar PV technology," Ampulse, 21st NREL Industry Growth Forum, Oct. 1, 2008.

Hane, S., "Filim-Silicon PV: The Next Generation in Solar Technology," Ampulse, Cleantech Venture Forum, Washington, DC, Sep. 2008.

International Preliminary Examination Report dated Aug. 25, 20211 for International Application No. PCT/US09/33937.

Goyal, A. et al., "Low cost, single crystal-like substrates for practical, high efficiency solar cells," AIP Conf. Proc. 404: 337 (1997).

Teplin, C.W. et al., "Hot-Wire Chemical Vapor Deposition Epitaxy on Polycrystalline Silicon Seeds on Glass," Mater. Res. Soc. Symp. 0989-A06-16 (2007).

Feldmann, D.M. et al., "Influence of nickel substrate grain structure on YBa2Cu3O7-x supercurrent connectivity in deformation-textured coated conductors," Appl. Phys. Lett., 77(18): 2906-2908, (Oct. 30, 2000).

Templin, C.W. et al., "A Proposed Route to Thin Film Crystal Si Using Biaxially Textured Foreign Template Layers," National Renewable Energy Laboratory, NREL/CP-520-38977 (2005).

NREL 08-53 Final Office Action dated Sep. 13, 2012 for U. S. Appl. No. 12/537,185.

NREL 08-80 Final Office Action dated Aug. 29, 2012 for U.S. Appl. No. 13/148,925.

Golubenko, G.A. et al., Total reflection of light from a corrugated surface of a dielectric waveguide, Institute of General Physics, Academy of Sciences of the USSR, Moscow, Kvantovaya Ekektron., V12, Jul. 1985.

Tibuleac, S. et al., Reflection and transmission guided-mode resonance filters, Journal of Optical Society of America, V14, No. 7, Jul. 1997.

Mashev, L. et al., Zero Order Anomaly of Dielectric Coated Gratings, Optics Communications, V55, No. 6, 15 Oct. 1985.

Mateus, C.F.R. et al., Ultrabroadband Mirror Using Low-Index Cladded Subwavelength Grating, IEEE Photonics Technology Letters, V16, No. 2, Feb. 2004.

Popov, E. et al., Theoretical Study of the Anomalies of Coated Dielectric Gratings, Optica Acta: International Journal of Optics, 33:5, 607-619, 1986.

Willner, A.E. et al., All mirrors are not created equal, Nature Photonics, V1, Feb. 2007.

Wang, S.S. et al., Theory and applications of guided-mode resonance filters, V32, No. 14, May 10, 1993.

NREL 08-53 Non-Final Office Action dated Dec. 21, 2012 for U.S. Appl. No. 12/537,185.

Vincent, P. et al., Corrugated Dietectric Waveguides: A Numerical Study of the Second-Order Stop Bands, Applied Physics, V20, 1979.

Sai, H. et al., "Back surface reflectors with periodic textures fabricated by self-ordering process for light trapping in thin-film microcrystalline silicon solar cells," Solar Energy Materials & Solar Cells, vol. 93 Issue 6-7 pp. 1087-1090; DOI: 10.106/j.solmat.2008. 12.030, Feb. 5, 2009.

Sai, H. et al., "Effect of self-orderly textured back reflectors on light trapping in thin-film microcrystalline silicon solar cells, " Journal of Applied Physics Vol. 105 Issue 9, Article No. 094511:: DOI: 10.1063/1.3108689, May 14, 2009.

Zhou, D. et al., "Photonic crystal enhanced light-trapping in thin film solar cells," Journal of Applied Physics, vol. 103 Issue 9, Article No. 093102; DOI: 10.1063/1.2908212, May 1, 2008.

Bermel, P. et al., "Improving thin-film crystalline silicon solar cell efficiencies with photonic crystals," Optics Express vol. 15 No. 25, pp. 16986 - 17000; Dec. 10, 2007.

Franken, R.H. et al., "Understanding light trapping by light scattering textured back electrodes in thin film n-i-p-type silicon solar cells," Journal of Applied Physics, vol. 102 Issue 1, Article No. 014503; Doi: 10.1063/1.2751117, Jul. 5, 2007.

Zeng, L. et al., "Efficiency enhancement in Si solar cells by textured photonic crystal back reflector," Applied Physics Letters vol. 89 Issue 11, Article No. 111111; DOI: 10.1063/1.2349845, Sep. 11, 2006.

Avrutsky, I.A. et al., Reflection of a beam of finite size from a corrugated waveguide, Journal of Modern Optics, V36, No. 11, 1989.

Ding, Y. et al., Resonant leaky-mode spectral-band engineering and device applications, Optics Express, V12, No. 23, Nov. 15, 2004.

Ding, Y., et al., Band gaps and leaky-wake effects in resonant photonic-crystal waveguides, Optics Express, V15, No. 2, Jan. 22, 2007.

Gaylord, T.K. et al., Analysis and Applications of Optical Diffraction by Gratings, Proceedings of the IEEE, V73, No. 5, May 1985.

Hardy, A. et al., Analysis of Second-Order Gratings, IEEE Journal of Quantum Electronics, V25, No. 10, Oct. 1989.

Huang,M.C.Y et al., A surface-emitting laser incorporating a high-index-contrast subwavelength grating, Nature Photonics, V1, Feb. 2007.

Lee, Y-C, et al., Enhanced light trapping based on guided mode resonance effect for thin-film silicon solar cells with two filling-factor gratings, Optics Express, V16, No. 11, May 26, 2008.

Magnusson, R. et al., New principle for optical filters, Applied Physics Letters, V61, 1992.

Magnusson, R. et al., Physical basis for wideband resonant reflectors, Optics Express, V16, No. 5, Mar. 3, 2008.

Mateus, C.F.R. et al., Broad-Band Mirror (1.12-1.62 μm) Using a Subwavelength Grating, IEEE Photonics Technology Letters, V16, No. 7, Jul. 2004.

Meng, X. et al., Combined front and back diffraction gratings for broad band light trapping in thin film solar cell, Optics Express, V20, No. S5, Sep. 10, 2012.

Peng, S.T. et al., Theory of Periodic Dielectric Waveguides, IEEE Transactions on Microwave Theory and Techniques, V MMT-23, No. 1, Jan. 1975.

Rosenblatt, D. et al., Resonant Grating Waveguide Structures, IEEE Journal of Quantum Electronics, V33, No. 11, Nov. 1997.

US 7,619,822, 11/2009, Gruhike et al. (withdrawn)

BACK CONTACT TO FILM SILICON ON METAL FOR PHOTOVOLTAIC CELLS

CONTRACTUAL ORIGIN

The United States Government has rights in this invention under Contract No. DE-AC36-08GO28308 between the United States Department of Energy and the National Renewable Energy Laboratory, managed and operated by the Alliance for Sustainable Energy, LLC.

BACKGROUND

Photovoltaic cells, sometimes referred to as "solar cells," convert sunlight into electricity. Photovoltaic cells are often made of multiple layers of semiconductor material, such as silicon. When sunlight or other light energy strikes a photovoltaic cell, photons excite electrons in the semiconductor material to a higher energy state and liberate electrons from their bonding energy levels, thereby producing transporting electron charge carriers and transporting hole carriers in the vacated energy levels. Typically, the liberated electrons flow in one direction through the semiconductor material and holes flow in the opposite direction to a different layer of semiconductor material. Much like a typical battery with a positive and negative contact, in order to use the generated electricity, a first contact or set of contacts are coupled to the layer or layers of the semiconductor material collecting electrons and a second contact or set of contacts are coupled to the layer or layers of semiconductor material collecting holes to extract the electrons and holes at their respective potential energy levels. Since the electrical potential, or voltage, of any given photovoltaic cell is often small, cells or groups of cells are often coupled together in electrical series in modules to form a higher voltage array. Other cells or groups of cells are often coupled together in electrical parallel connection in modules to form a higher current array.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be examples and illustrative, not limiting in scope. In various embodiments, one or more of the above-described problems have been reduced or eliminated, while other embodiments, are directed to other improvements.

In one embodiment, a photovoltaic device and methods for making the photovoltaic device are disclosed. The photovoltaic device includes a metal substrate with a crystalline orientation and a heteroepitaxial crystal semiconductor (e.g., silicon) layer having the same crystal orientation of the metal substrate. A heteroepitaxial buffer layer having the crystal orientation of the metal substrate is positioned between the substrate and the crystal semiconductor layer to reduce diffusion of metal from the metal foil into the crystal silicon layer and provide chemical compatibility with the heteroepitaxial semiconductor silicon layer. Conventionally, this buffer layer is electrically insulating and presents difficulties in contacting one side of the semiconductor. However, the buffer layer, as discussed in some implementation set out herein, includes one or more electrically conductive pathways to electrically couple the crystal silicon layer and the metal substrate.

In an alternative embodiment, a method for creating a conductive pathway in a photovoltaic cell is disclosed. The method includes obtaining a layered photovoltaic device having a metal substrate with a crystal orientation, a semiconductor layer with the crystal orientation and a heteroepitaxially grown buffer layer positioned between the substrate and the crystal semiconductor layer. The method further includes forming one or more conductive pathways between the crystal semiconductor layer and the metal substrate, the pathways being through at least a portion of the buffer layer.

In another alternative embodiment, a method for creating a conductive pathway in a photovoltaic cell is disclosed. The method includes forming apertures in a buffer layer grown over a metal substrate, the metal substrate and the buffer layer having a common crystalline structure. Additionally, the method includes heteroepitaxially growing a crystal semiconductor layer after forming the apertures in the buffer layer, the apertures being filled with conductive material to form a conductive pathway in the buffer layer between the crystal semiconductor layer and the metal substrate.

In yet another alternative embodiment, there is disclosed a photovoltaic cell. The photovoltaic cell includes a back contact comprising a nickel tungsten foil substrate textured by a rolling-assisted process to have a crystal orientation and a doped first crystal silicon layer heteroepitaxially grown and having the same crystal orientation as the nickel tungsten foil substrate. Further, the photovoltaic cell includes a heteroepitaxially grown buffer layer positioned between the crystal silicon layer and the nickel tungsten foil substrate, the buffer having the same crystal orientation as the crystal silicon and the nickel tungsten foil substrate. The buffer layer additionally includes at least one conductive pathway electrically coupling the back contact and the crystal silicon layer.

In yet another alternative embodiment, there is disclosed a method of electrically coupling a crystal oriented metal substrate of a photovoltaic cell with an absorber layer of the photovoltaic cell. The method includes creating a conductive pathway in a heteroepitaxially grown buffer layer positioned between the crystal oriented metal substrate and the absorber layer, wherein the conductive pathway is formed by diffusing metal from the metal substrate through the buffer layer or by creating apertures in the buffer layer and filling the apertures during heteroepitaxial growth of the absorber layer. Both the buffer layer and the absorber layer have the same crystal orientation of the metal substrate.

In addition to the various examples, aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

Figure 10A:
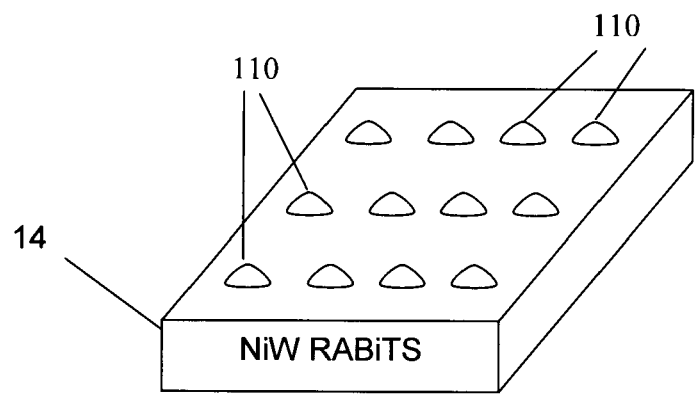
Figure 10B:
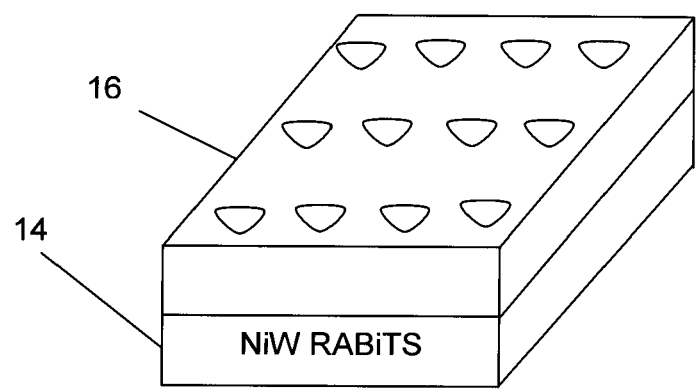
Figure 10C:
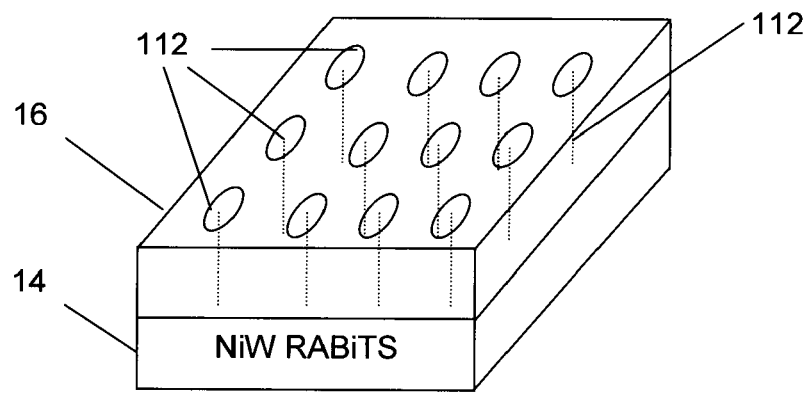
Figure 10D:
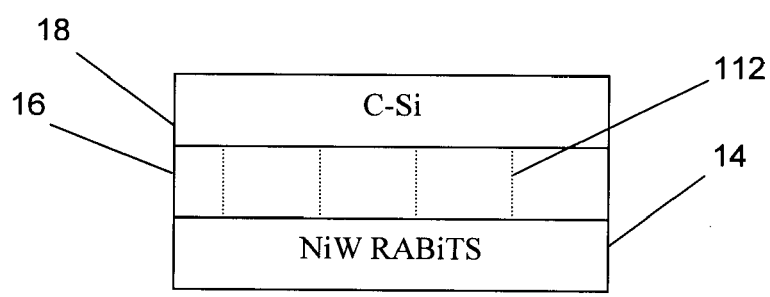

FIGS. 10A-10C illustrate successive representative isometric views of an embodiment for coupling the first crystal silicon layer with the metal substrate by applying droplets on the metal substrate which weaken the buffer layer or to which the buffer layer does not adhere, forming the buffer layer and removing portions of the buffer layer formed over the droplets, with FIG. 10D being a representative section view of FIG. 10C.

Figure 10E:
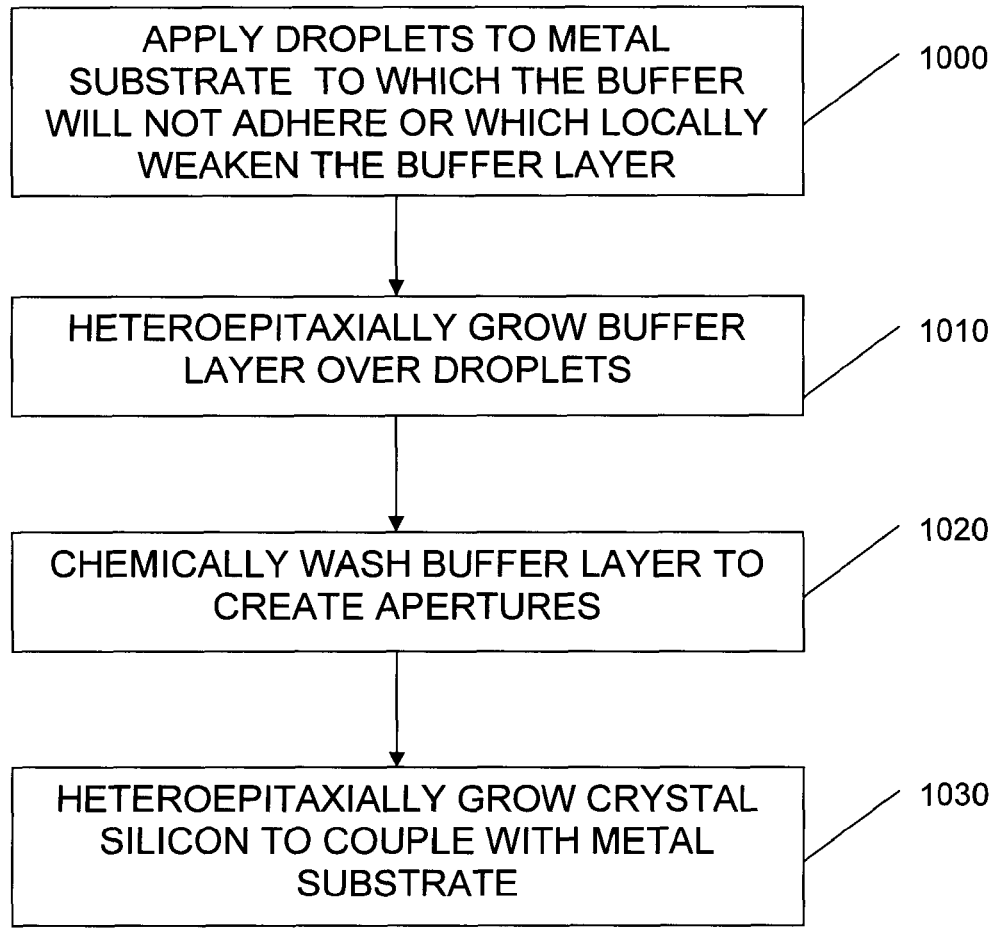

FIG. 10E is a flowchart related to the embodiment illustrated in FIGS. 10A-10D.

DESCRIPTION

Various embodiments and processes described herein set forth photovoltaic cells and processes that provide a conductive pathway between a heteroepitaxially grown semiconductor layer(s) and a buffer covered metal substrate. The conductive pathways may allow the collection of electrons or holes initiated in the semiconductor layers from light energy thereby allowing the cell to generate power. One aspect of this disclosure involves providing the conductive pathways in a buffer layer located between the semiconductor layer(s) and the metal substrate, either before or after formation of the semiconductor layer. The metal substrate may provide a contact and the apertures provide a mechanism to facilitate the migration through the buffer layer of electrons or holes generated in the semiconductor layer(s) through the photovoltaic effect. Implementations set forth herein electrically couple the various layers, e.g. metal substrate and semiconductor, while preserving the crystalline structure of the semiconductor layer.

Although brief descriptions of the various steps generally involved in forming a heteroepitaxially grown semiconductor layer over a buffer covered metal substrate are included herein, PCT Patent Application No. PCT/US09/33937, entitled, "Crystal Silicon Processes and Products," (NREL PCT/08-80) filed on Feb. 21, 2009, is incorporated herein by reference in its entirety and for all purposes, and may be referred to for additional information regarding the process of heteroepitaxially growing a semiconductor material over a metal substrate.

Figure 1A:
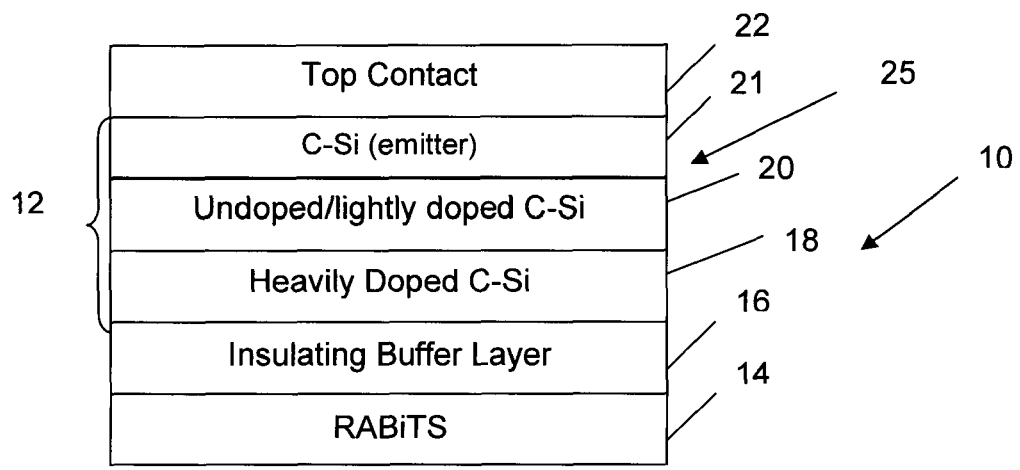
FIGS. 1A-1B illustrate a representative cross-sectional view of a crystal silicon structure heteroepitaxially grown over a buffer covered metal substrate and a top view of the crystal silicon structure, respectively.

Turning to the figures and referring initially to FIG. 1A, a simplified representative cross-section of one example of a photovoltaic cell 10 having crystal silicon layers 12 heteroepitaxially grown over a buffer 16 covered metal substrate 14 is illustrated. Examples discussed herein reference crystal silicon layers; however, other semiconductor materials such as Gallium Arsenide, etc. are possible. The total thickness of the crystal silicon layer 12 may be between approximately 2 and 20 micrometers thick. The crystal silicon layer 12 may act as absorber layers that absorb photons that strike the photovoltaic cell 10. The metal substrate 14 may be between approximately 20 to 300 microns thick and made of one or more metals, alloys or other materials. In one particular implementation, the metal substrate is made of nickel-tungsten (NiW). For the purposes of this discussion, the metal substrate 14 may be referred to as the NiW substrate, NiW layer, metal substrate, metal layer, substrate, or other suitable terms.

It should be appreciated that the illustration of FIG. 1A and all other figures presented herewith do not represent an accurate scale for the features shown therein. Thus, the illustrations contained in the figures are to be understood as being instructional and generally not representative of relative sizes and shapes of the illustrated features.

The metal substrate 14 may be fabricated in part through a process referred to as "RABiTS" (rolling assisted biaxially textured substrates) that imparts a biaxial orientation in the metal substrate. In other embodiments, the metal substrate 14 may have other crystalline orientations, such as uniaxial orientation, for example. Hence, the metal substrate 14 has a well-organized, consistent biaxially, uniaxially, or otherwise oriented crystalline structure. The biaxial orientation of the substrate 14 may serve as a template for other layers formed over the metal substrate 14. Hence, one or more layers of the photovoltaic cell 10 may have a common orientation. The orientation may increase the overall efficiency of the photovoltaic cell 10 by decreasing the number of defects through the photovoltaic cell structure and thereby improving the efficiency of photogenerated electron and hole collections at electrical contacts.

After the metal substrate 14 is textured, one or more buffer layers 16 may be heteroepitaxially grown on the metal substrate 14. Through heteroepitaxy, different material (from the substrate) layers is fabricated that has the same texture (e.g. biaxial) as the substrate 14. For example, as illustrated, the metal substrate 14 may be covered with an insulating buffer layer 16 made of one sub-layer of magnesium oxide (MgO) and a second sub-layer of gamma-aluminum oxide ($Al_2O_3$). Other materials may also be used to form the buffer 16 and this layer may contain several different sub-layers. The insulating buffer 16 may be between approximately 20 and 500 nanometers thick. While only one buffer layer is shown, additional buffer layers, combinations of buffer layers, or other buffer layers, such as reflective layer, are also possible.

Among other things, the buffer layer 16 may prevent leakage of metal atoms from the metal substrate 14 into the crystal silicon layers 12. For example, the buffer layer 16 may prevent diffusion of nickel and/or tungsten from the metal substrate 14 into the silicon layers 12 during epitaxial growth of the silicon layers 12. Epitaxial growth may involve temperatures between about 620 to 1000 degrees Celsius over a period of 10-60 minutes. Without a buffer layer, nickel, for example, can be expected to diffuse one micron into the silicon layer in 20 minutes at 800 degrees Celsius. Nickel causes rapid electron-hole pair recombination in silicon and hence such Ni diffusion into the silicon impairs the function of the cell. Alternatively, the diffusion of the nickel into the silicon layer may lead to shunting of the semiconductor material of the photovoltaic cell 10 through conductive nickel silicide pathways. In addition to reducing or eliminating any diffusion or adverse effects of diffusion of the metal substrate 14 metals, the buffer layer 16 may also provide a chemically compatible surface for the growth of the silicon layers 12.

Once the buffer layer 16 is formed, one or more layers 12 of crystal silicon may be heteroepitaxially grown over the buffer layer 16 to form the semiconductor region of the photovoltaic cell 10 that comprises absorber layer, junction-forming layers, contacting layers and other layers that are known to assist in absorbing incident photons and collecting the photogenerated electrons and holes. In the particular example shown in FIG. 1A, a first crystal silicon layer 18 is heteroepitaxially grown on the buffer layer 16. The first crystal silicon layer 18 may be doped with an atom such as boron, phosphorus, arsenic, or gallium, for example, to create a charged n+ or p+ region. For example, the first silicon layer 18 may be doped with phosphorus to form an n+ region to facilitate the flow of electrons toward the buffer layer when photons strike the photovoltaic cell 10. Moreover, the highly doped first crystal silicon layer 18 may also act as a high lateral conducting semiconductor layer that allows electrons or holes to migrate to electrical contact points in layer 18.

Additional crystal silicon layers 20 and 21 may be heteroepitaxially grown over the first crystal silicon layer 18. The additional layer 20 may or may not be doped in order to act as the primary absorber region of the cell. Absorber region generally may refer to the semiconductor material in a photovoltaic cell that is the primary region of absorbing photons (through photogeneration of free electrons and holes) that are needed generate electrical power from the photovoltaic cell. Additional layer 21 is often termed the emitter and is doped to have an opposite charge from the highly doped first crystal layer 18 and may represent multiple layers doped to varying degrees. This doped layer 21 typically forms at the interface with layer 20 a p-n junction 25 that facilitates the flow of electrons or holes toward the top of the photovoltaic cell where a top contact 22 may be located. In other photovoltaic semiconductor layer designs the absorber layer 20 may be undoped and with layers 19 and 21 form a p-i-n structure with an extended region of electric field in the device that assists in collecting photoexcited electrons and holes. The crystal silicon layers 12 may have the same crystal orientation as the metal substrate 14. For example, if the metal substrate 14 has a biaxial orientation, the first crystal silicon layer 18, the second crystal silicon layer 20, the emitter layer 21 and any other layers have the same biaxial orientation.

Figure 1B:
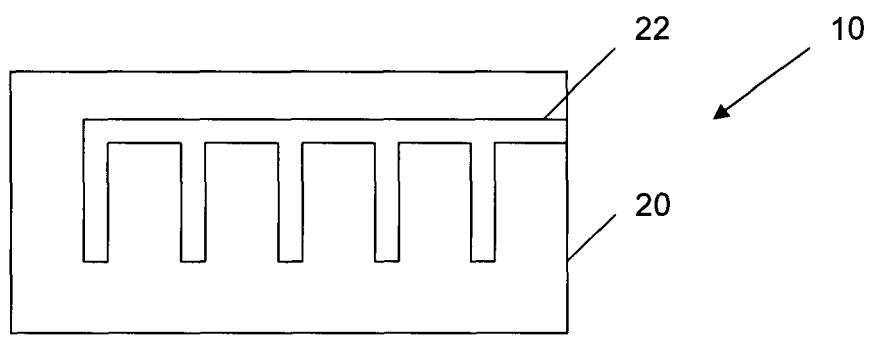

FIG. 1B is a top view of the photovoltaic cell 10 of FIG. 1A showing the top contact 22. The top contact 22 may have a comb shape, serpentine shape, or other shape to limit its obstruction of light that can reach the underlying crystal silicon layers 12 while still providing an accessible conductive pathway for electrons or holes. It should be understood that although the term "top contact" and "bottom contact" are used herein, they are used as relative terms and not intended to be limiting terms. Indeed, in some instances, the terms may be interchangeable.

Having a metal substrate 14 may have several advantages over conventional silicon wafer or glass substrate photovoltaic cells, including the ability to use the metal substrate 14 as a back contact. Generally, a back contact may be a conductive material to which leads or wires may be coupled to allow for a generated voltage to be used in an electrically circuit. For the metal substrate 14 to act as a contact, a conductive path between the substrate 14 and the absorber region is provided so that the insulating layer does not provide a conductive barrier.

Figure 1C:
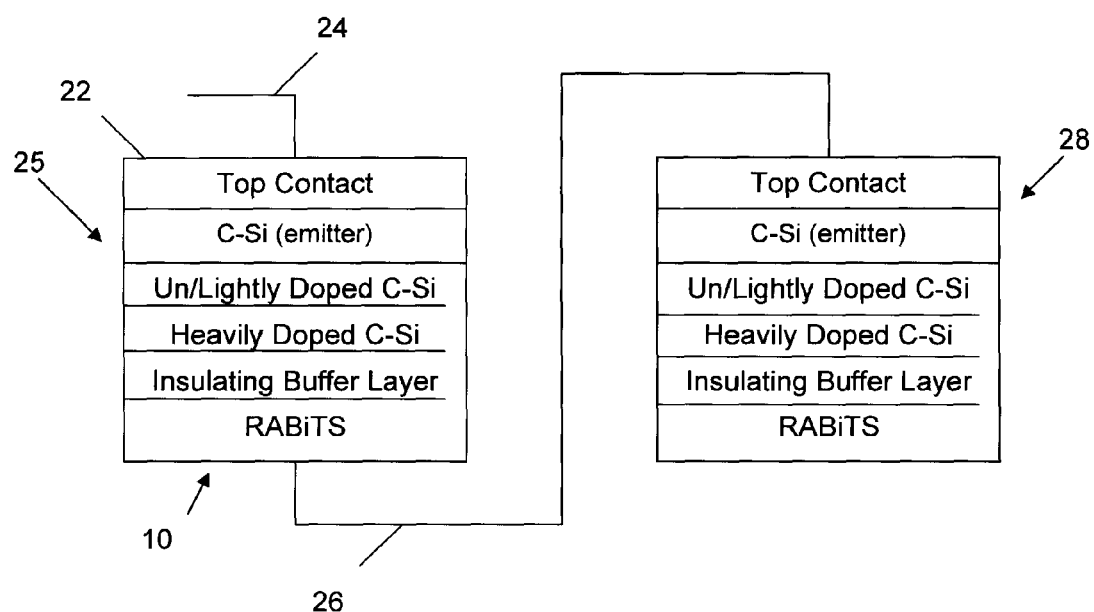
FIG. 1C illustrates two crystal silicon structures of FIG. 1A electrically coupled in series.

Using the metal substrate 14 as the back contact, the photovoltaic cell 10 may function as a true replacement in conventional module assembly. Stated differently, the photovoltaic cell 10 may directly replace conventional solar cells without extensive reworking of modules to accommodate the photovoltaic cell 10. FIG. 1C illustrates a serial connection of photovoltaic cells 10, wherein the top contact 22 is coupled to a top lead 24 and the metal substrate 14, which in some embodiments may function as a back contact, is coupled to a bottom lead 26. The top lead 24 may be coupled to a bottom contact of another cell (not shown) while the bottom lead 26 may be coupled to a top contact of an adjacent cell. Transparent conductor lines (not shown) may be present. Multiple cells 10 may be coupled either in series, as shown, in parallel, or in a series/parallel arrangement to form a module.

Various implementations set forth herein provide examples of different ways to electrically couple the crystal silicon layer and the metal substrate. Hence, in some examples, the formation of a conductive pathway between the first layer of crystal silicon 18 and the metal substrate 14 enables the metal substrate 14 to act as a back contact. Techniques discussed herein for coupling the first crystal silicon layer 18 to the metal substrate 14 may be initiated either before or after the formation of the crystal silicon or other forms of semiconductor layers 12. The following discussion presents several different techniques and related cell structures for processing of the cell both before and after the growth of the crystal silicon layer, starting with descriptions of techniques that may be initiated after the formation of at least one crystal silicon layer. Additionally, as the focus is on connecting the heavily doped crystal silicon layer 18 with the metal substrate, other layers are not illustrated or discussed further, but should be understood as being disclosed and included when implementing the techniques discussed herein to create a photovoltaic cell.

Figure 2A:
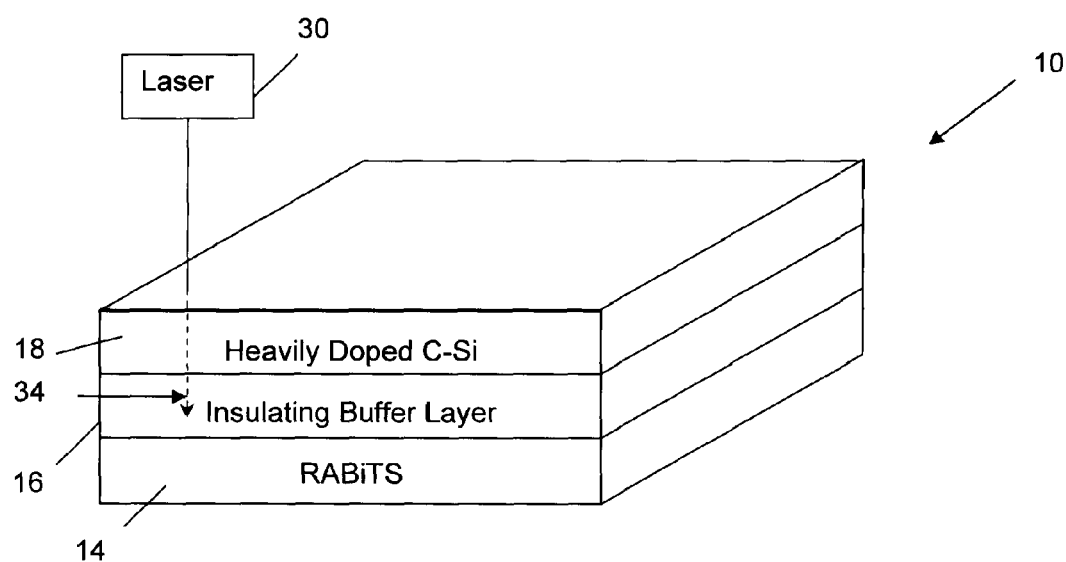
FIGS. 2A-2B illustrate an embodiment for coupling a first crystal silicon layer with a metal substrate using a laser to create a conductive pathway in a buffer layer and a flowchart of a related process, respectively.
Figure 2B:
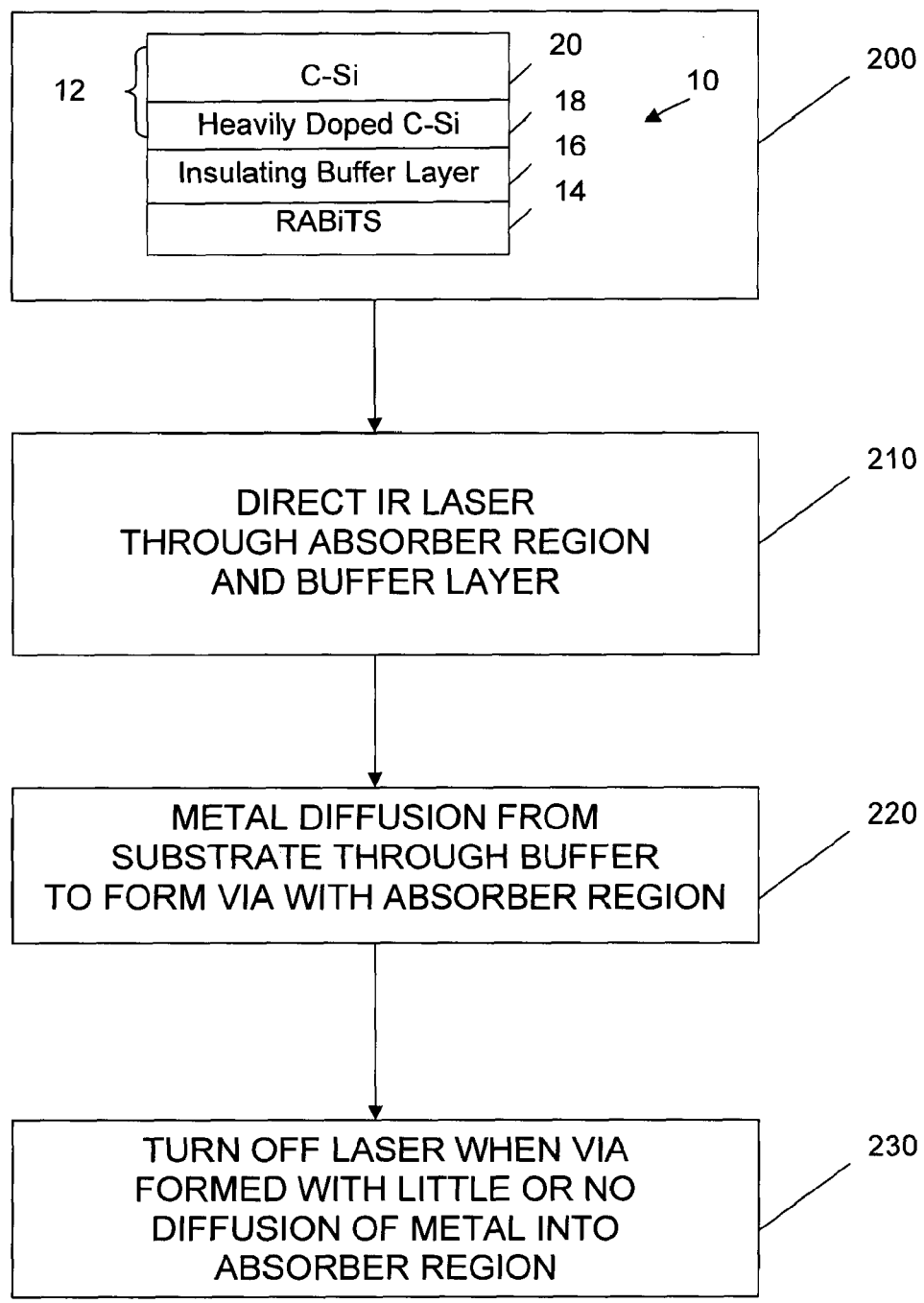

Referring to FIG. 2A and the flowchart shown in FIG. 2B, a process for forming conductive pathways through the buffer layer 16 is illustrated. The process begins with a formed structure of a solar cell including a buffer coated NiW textured (RABiTS) metal substrate 14 with a plurality of semiconductor absorber layers heteroepitaxially grown on the buffer layer 16 (operation 200 in FIG. 2B). A plurality of conductive vias 34 are formed within the buffer layer 16 and between the metal substrate 14 and the absorber layers 12. The conductive vias 34 are formed after growth of the absorber layers 12 by using a laser 30 of suitable spectrum, e.g. infrared, that passes through the silicon of the absorber layers 12 without damaging their crystalline structures. The laser energy is absorbed at the interface between the metal layer 14 and buffer layer 16 (operation 210). The localized heat generated by absorption of the laser light at the metal substrate 14 may cause diffusion of metal through the insulator 16 to form a discrete conductive via 34 between the crystal silicon 18 and metal substrate 14 (operation 220). As may be understood, the vias 34 may be created before or after the addition of the semiconductor junction and transparent conductor layers.

In one example, the laser 30 may be an infrared laser, such as a $CO_2$ or YAG laser for example, or other laser configured to operate at a wavelength or wavelengths above the silicon absorption edge so that the silicon is transparent to the laser 30 and the light is absorbed at the metal substrate 14. Additionally, the intensity of the laser 30 may be selected to induce metal from the substrate 14 through the buffer layer 16.

Figure 3A:
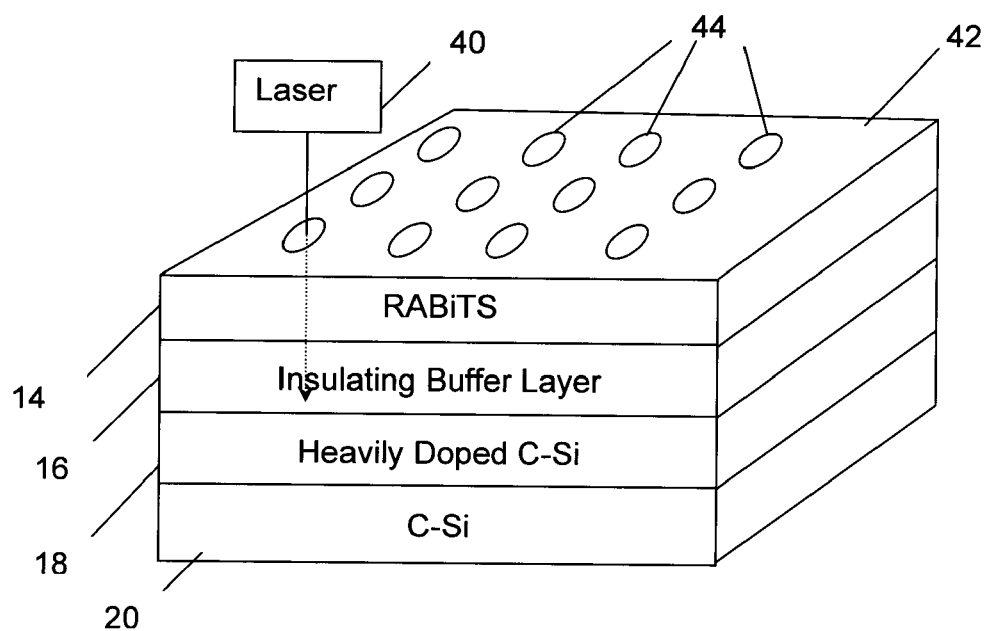
FIGS. 3A-3B illustrate an embodiment for coupling the first crystal silicon layer with the metal substrate using a laser to drill through the metal substrate and a flowchart of a related process, respectively.
Figure 3B:
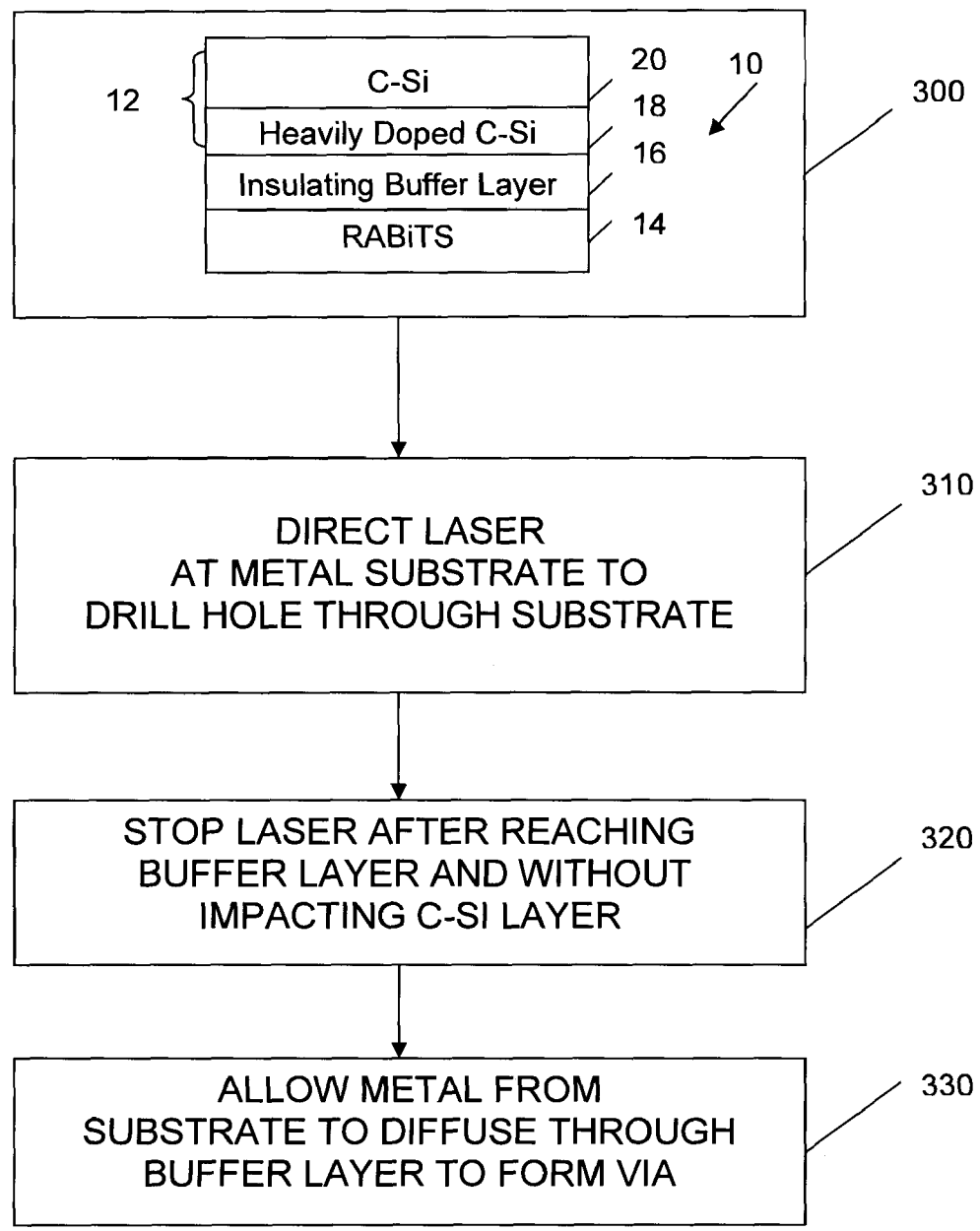

FIG. 3A and the flowchart illustrated in FIG. 3B illustrate an alternative embodiment that, like FIGS. 2A-2B, begins with the fabricated photovoltaic cell 10 that includes a textured metal substrate 14, a buffer layer 16, and absorber layers (operation 300). Unlike the embodiment illustrated in FIGS. 2A-2B, a laser 40 may be directed at a backside 42 of the metal substrate 14 to drill through the metal substrate 14 (operation 310). The laser 40 may ablate and melt the metal of the metal substrate 14 until an aperture 44 is formed to the buffer layer 16. The laser 40 may be stopped after drilling through the substrate 14 (operation 320). Due to the localized heating from the laser, metal from the substrate 14 diffuses or otherwise passes through the insulating buffer layer 16 to form a contact (conductive path) with the heavily doped crystal silicon layer 18 (operation 330). In this embodiment, the laser 40 may be any laser suitable for drilling through metal, including visible light lasers and ultraviolet lasers.

As illustrated, multiple apertures 44 may be drilled through the substrate 14 to form an array. The spacing of the apertures 44 in the array may be selected based upon the lateral conductivity of the doped silicon layer 18 so as to provide a series resistance of the entire cell 10 at an acceptably low level. That is, as the apertures 44 will serve as vias for the migration of electrons or holes out of the absorber layers, the apertures 44 may be spaced so that any hole or electron does not encounter resistance that produces a loss of electric potential of the hole or electron and losses to resistive heating beyond a practical level for operation of the photovoltaic cell 10. For example, in some embodiments, the first crystal silicon layer 18 may be approximately one micron thick with an approximate conductivity less than or equal to $5 \times 10^3$ s/cm which is equivalent to a resistivity approximately equal to or greater than $2 \times 10^{-4}$ Ohm cm. This corresponds to a concentration of approximately $5 \times 10^{20}$ $cm^{-3}$ of phosphorus doping. For example, a half centimeter path length through the doped layer corresponds to a series resistance of approximately 1 Ohm/cm length. Assuming each square centimeter of the doped crystal silicon generates about 25-30 mA of current and the apertures 32 are located approximately a centimeter apart laterally, the greatest distance a hole or electron may need to travel is not greater than approximately one half a centimeter, a voltage drop of 30 mA times one Ohm/cm times one-half cm equals approximately 15 mV, which may be acceptable. Hence, the apertures 44 may be laterally separated up to one centimeter, or more. Similar spacing and array arrangement may be provided for each of the embodiments discussed herein. In one embodiment, the metal substrate 14 may be overcoated with a metal to fill the apertures 44 and complete the conducting pathway.

Figure 4A:
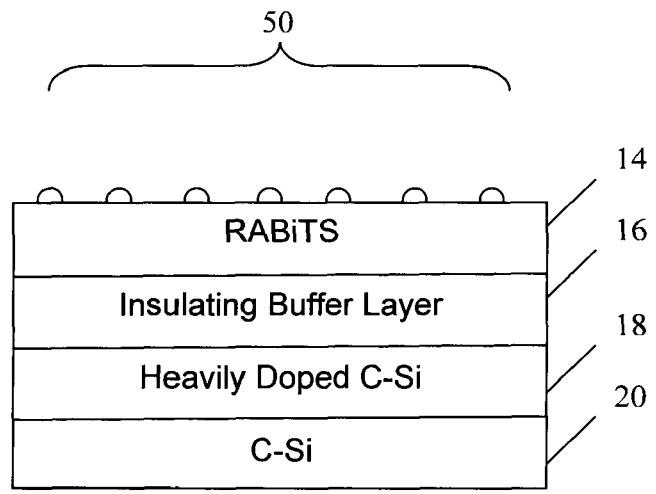
FIGS. 4A-4C illustrate successive representative section views of an embodiment for coupling the first crystal silicon layer with the metal substrate using an etchant to create apertures in the metal substrate and the buffer layer.
Figure 4B:
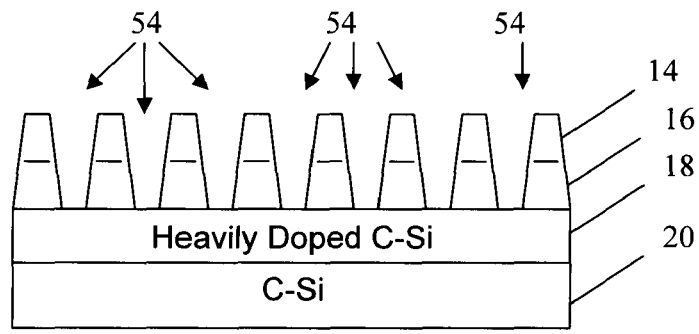

In yet another alternative process illustrated in FIGS. 4A-4D that begins with the structure shown in FIGS. 1A and 1B (operation 400, FIG. 4D), the metal substrate 14 may be chemically etched to form apertures through the metal substrate 14 and the buffer layer 16. FIG. 4A illustrates an array of etchant 50 applied to the metal substrate 14 (operation 410). The etchant 50 may be any suitable etchant that does not react with silicon, including strong acids such as nitric acid and sulfuric acid, for example. Application of an etchant that is non reactive with silicon helps to preserve the absorber layer, and more particularly the crystalline structure of the absorber layers, from defects. Additionally, more than one etchant may be applied. For example, an etchant may first be applied for etching the metal substrate 14 and a second etchant may then be applied for etching the buffer layer 16. Alternatively, the etchant 50 may be a mixture of an etchant for the metal substrate 14 and an etchant for the buffer layer 16. The use of a mixture of etchants allows for a single application of etchant to create apertures in both the metal substrate 14 and the buffer layer 16.

The etchant 50 may be applied in a number of different ways. For example, the metal substrate may be masked with a resin or polymer (not shown) so thin it forms holes through which the etchant 50 may be applied. Alternatively, the resin or polymer (not shown) may contain embedded etchant 50 nanoparticles that may etch the metal substrate upon application of the resin or polymer to metal. In yet another alternative embodiment, the etchant 50 may be sprayed on in a fine mist or through an inkjet printer. Application of the etchant 50 using a fine mist may provide for random etchant application, whereas application using the inkjet printer may provide for a precise grid pattern or other patterns.

Figure 4C:
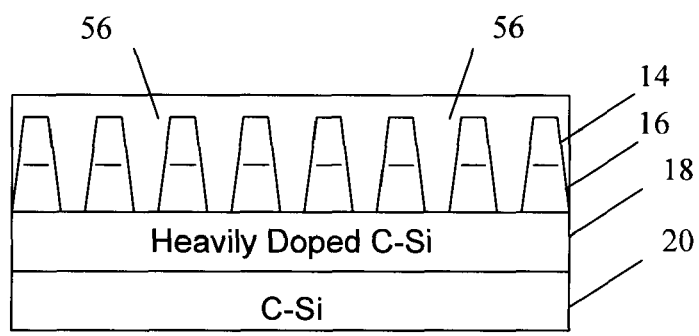
Figure 4D:
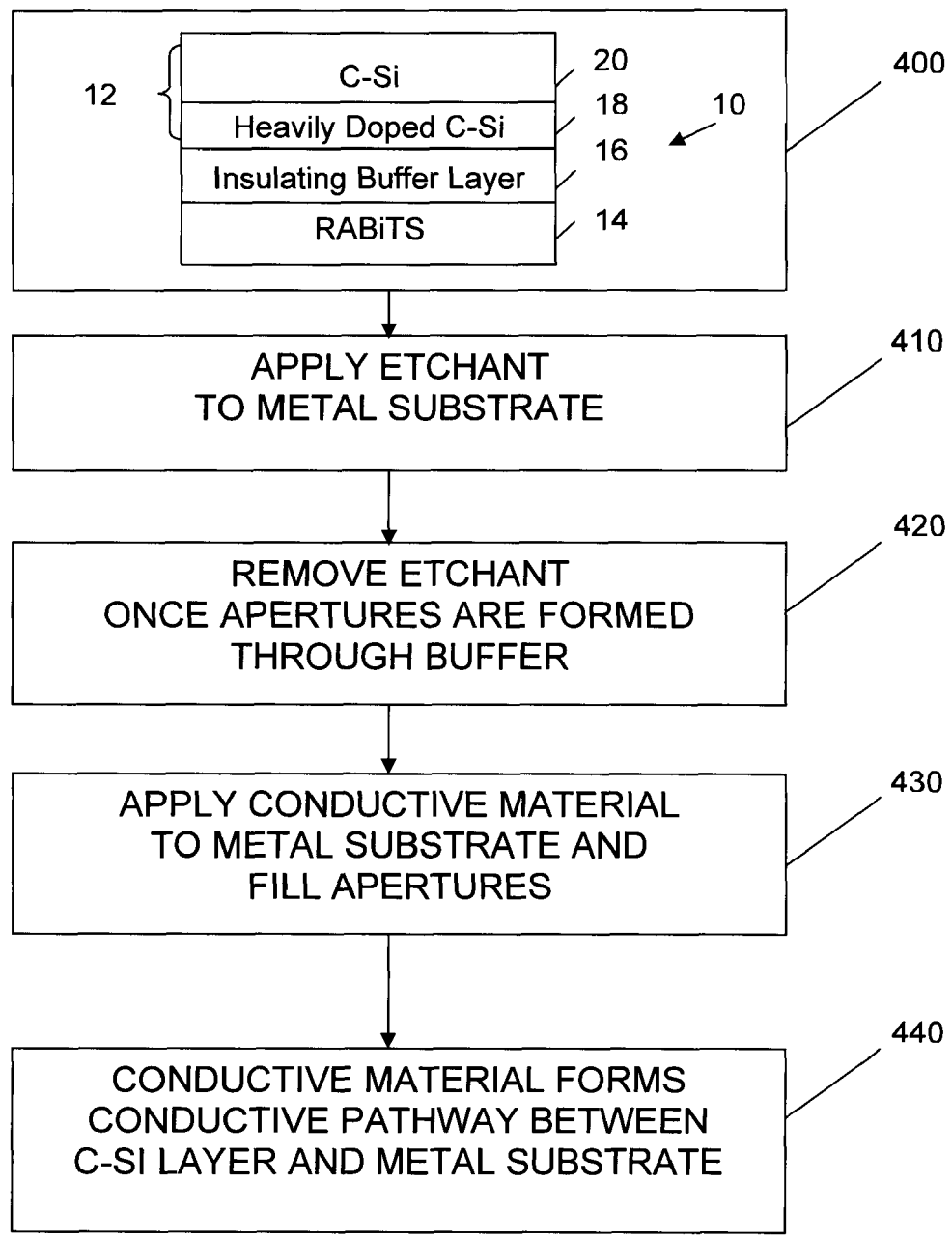
FIG. 4D is a flowchart of a process for using etchant to create apertures in the metal substrate and the buffer layer related to the embodiments illustrated in FIGS. 4A-4C.

Once the etchant 50 has been applied, the etchant 50 creates apertures through the metal substrate 14 and the buffer layer 16. To avoid significant intrusion of the etchant 50 into the absorber layers 12, the etching is stopped when apertures 54 are formed to the absorber layer adjacent the buffer, as shown in FIG. 4C (operation 420). Etching may be stopped by immersion in water or other chemical. A metal overcoating 56 may then be applied to the metal substrate 14, as illustrated in FIG. 4D (operation 430). The metal overcoating 56 may be applied by any suitable technique including printing, sputtering, evaporation, or via a metallic paste being spread over the backside 42 of the metal substrate 14. The metal overcoating 56 fills the apertures 54 through the buffer layer 16 and provides an electrically conductive pathway through the buffer layer 16 between the metal substrate 14 and the crystal silicon 18 (operation 440).

Each of the foregoing examples (FIGS. 2A-2B through 4A-4D) present possible techniques and structure that provide an electrical coupling of the metal substrate 14 with the first crystal silicon layer 18 after the first crystal silicon layer 18 has been formed. The following examples present possible techniques to create conductive connections in the buffer layer 16 prior to formation of the first crystal silicon layer 18 so that upon epitaxial growth of the first crystal silicon layer 18 there is an electrical coupling between the metal substrate 14 and the silicon.

Figure 5A:
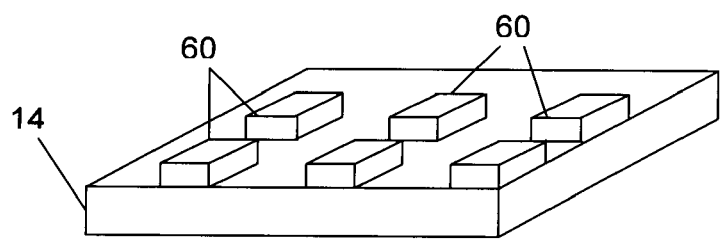
FIGS. 5A-5D illustrate successive representative section isometric views of an embodiment for coupling the first crystal silicon layer with the metal substrate by forming a grid of masking spots over the metal substrate prior to epitaxial growth of the buffer layer.
Figure 5B:
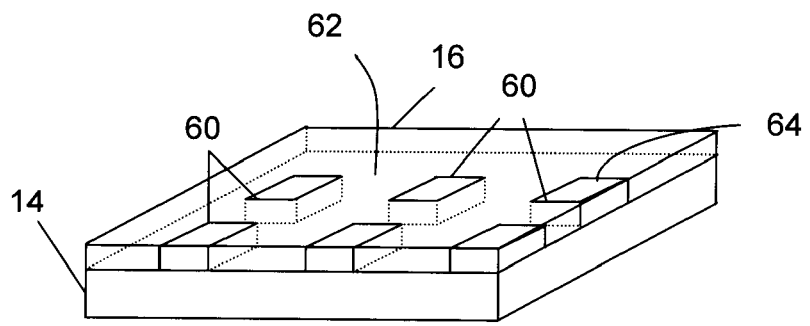
Figure 5C:
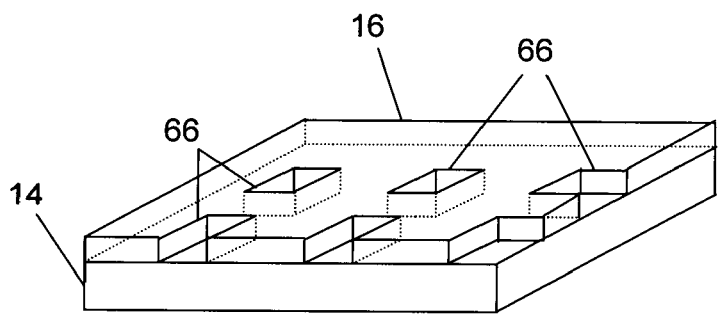
Figure 5D:
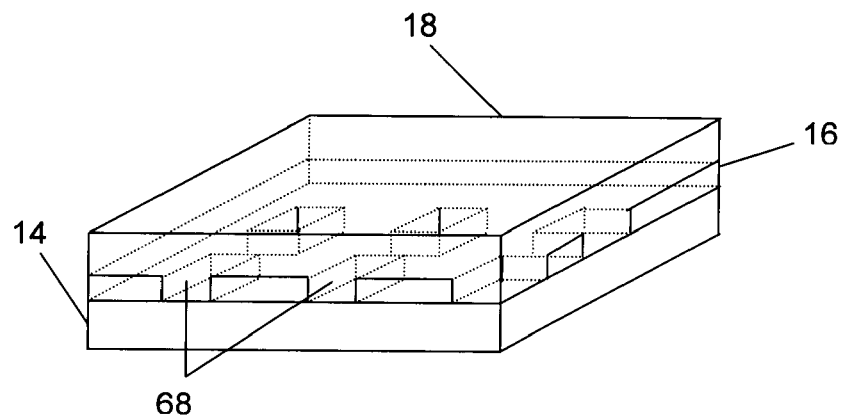
Figure 5E:
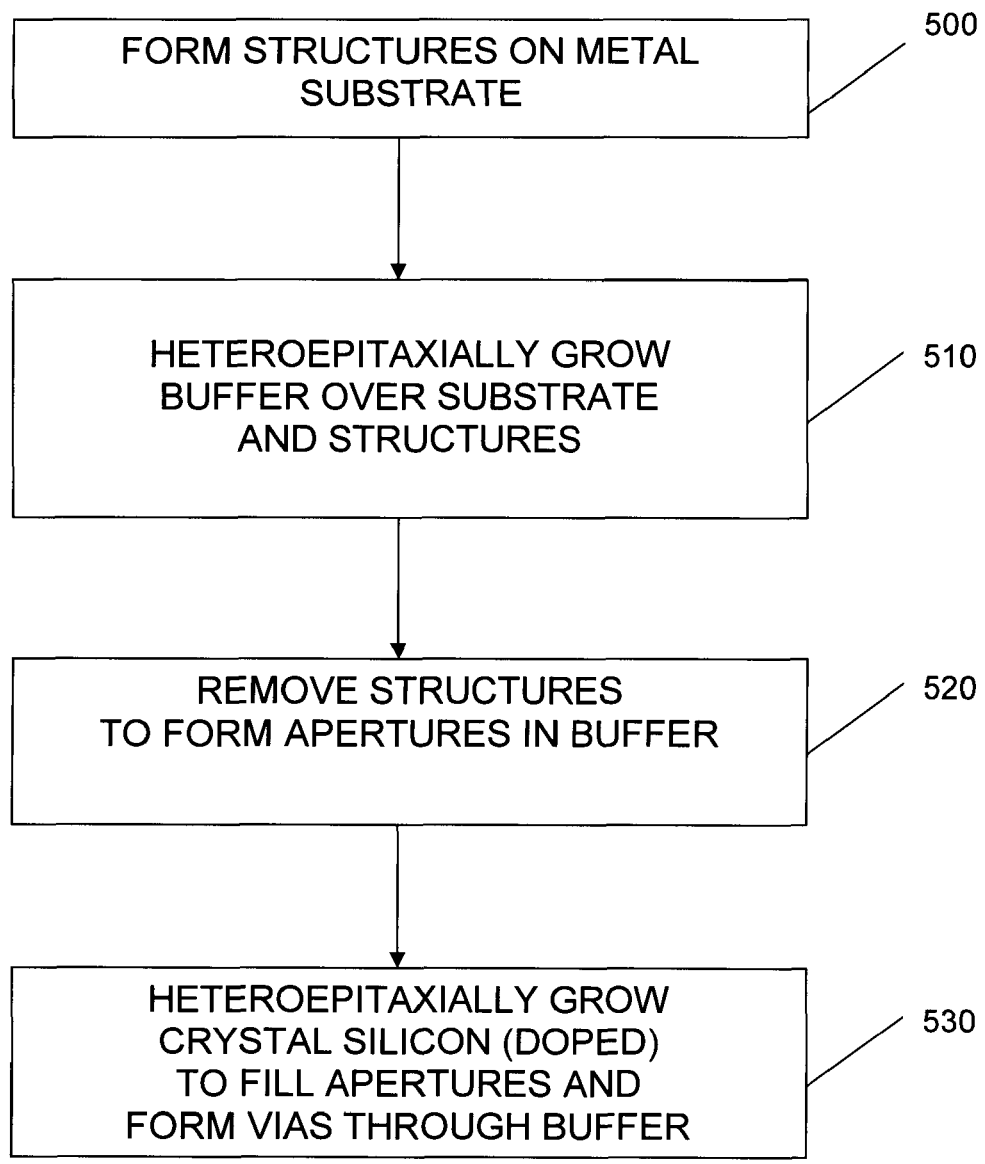
FIG. 5E is a flowchart illustrating a process related to the successive views illustrated in FIGS. 5A-5D.

FIGS. 5A-5D in conjunction with FIG. 5E illustrate a first example of creating apertures in a buffer layer prior to growing crystal silicon layers. First, with reference to FIG. 5A, an array of structures 60 are temporarily deposited or otherwise formed on the NiW substrate 14 (operation 500, FIG. 5E).

The structures 60 may be formed by any suitable photolithographic process or chemical etching process. In one embodiment, the structures 60 may be made of a material to which the buffer layer 16 is not inclined to adhere. For example, where the buffer layer 16 is a MgO/Al$_2$O$_3$ insulating buffer, the structures 60 may be a polymer. In an alternative embodiment, the structures 60 may be made of a material that locally weakens the buffer layer 16 in some way.

The spacing of the structures 60 in the array may be selected based upon the lateral conductivity of the doped silicon layer 18 to be formed over the buffer layer 16 so as to provide an acceptably low level of series resistance for the entire cell 10. It should be appreciated that FIG. 5A only illustrates a small portion of the representative structure, whereas the actual structure includes a grid of many more structures 60, each separated by some distance, such as one centimeter, depending on the size of the finished cell.

FIG. 5B illustrates formation of the buffer layer 16 over the NiW substrate 14 and the structures 60 (operation 510). The insulator 16 is deposited such that it is on the NiW substrate 14 and fills space between the structures 60. The insulator 16 may be approximately the same thickness as the structures 60, in particular implementations, such that a top level 62 of the insulation is approximately the same distance from the substrate 14 as a top level 64 of the structures 60.

Once the buffer layer 16 is formed, the structures 60 and any buffer material 16 that was formed over the structures 60 may be removed by chemical etching or other process, leaving the buffer layer 16 with apertures 66, as illustrated in FIG. 5C, for example (operation 520). The first crystal silicon layer 18 may then be formed over the buffer 16 and fills in the apertures 66 in the buffer layer 16 (operation 530). The silicon within the apertures 66 forms a conductor between the silicon layer and the substrate. For example, heteroepitaxially grown silicon on the buffer layer makes direct contact with the NiW substrate 14 only at selected areas 68, as illustrated in FIG. 5D.

As shown in FIGS. 1A-1C, the first crystal silicon layer 18 may be doped with phosphorus, arsenic or boron, for example, to form a highly doped crystal silicon layer 18. Additional crystal silicon layers 20 may be heteroepitaxially grown over the doped crystal silicon layer 18. These additional layers might be grown with low doping levels or with a complementary doping to layer 18 in order to form the pn junction necessary for the photovoltaic effect. Because of the doping of the first crystal silicon layer 18, good electrical contact is made with the metal substrate 14 and the entire NiW substrate 14 may function as a bottom contact for the photovoltaic cell 10. In an implementation with silicon conductive vias 68 separated approximately one centimeter apart, there may be resistive loss of only about 15 mV, as discussed above. This resistive loss accounts for the energy loss incurred by the hole or electron traveling through the crystal silicon to a contact.

Although the nickel may diffuse at above $10^{-11}$ cm$^2$ is into the silicon, the nickel moves only about one micron into the conductive region 18 during an 800 degree Celsius growth phase of the crystal silicon. Since levels of nickel should be left below about $10^{15}$ cm$^{-3}$ in silicon for reasonable solar cell operation, roughly 10 microns of spoiled silicon due to nickel diffusion may occur, as the concentration of the nickel diminishes the further into the silicon layer it diffuses. The loss of approximately 10 microns of silicon is not likely to be prohibitive, but suggests caution should be taken in exposing the first crystal silicon layer 18 to the nickel of the metal substrate 18 at the high temperatures of the silicon growth phase.

Figure 6A:
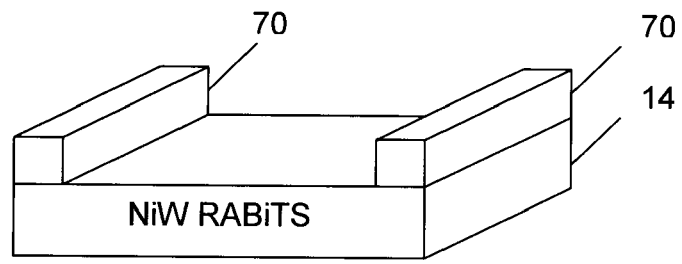
FIGS. 6A-6E illustrate successive representative isometric views of an embodiment for coupling the first crystal silicon layer with the metal substrate by forming polymer structures on the metal substrate prior to epitaxial growth of the buffer layer.
Figure 6B:
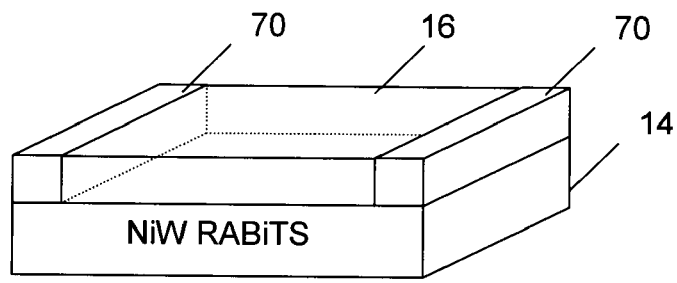
Figure 6C:
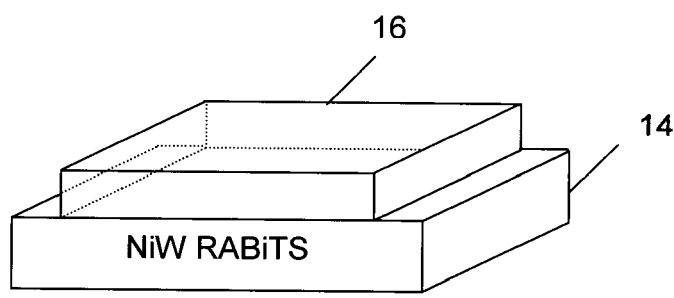
Figure 6D:
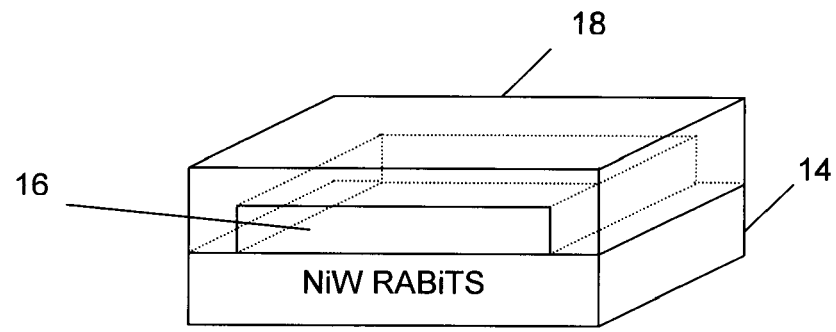
Figure 6E:
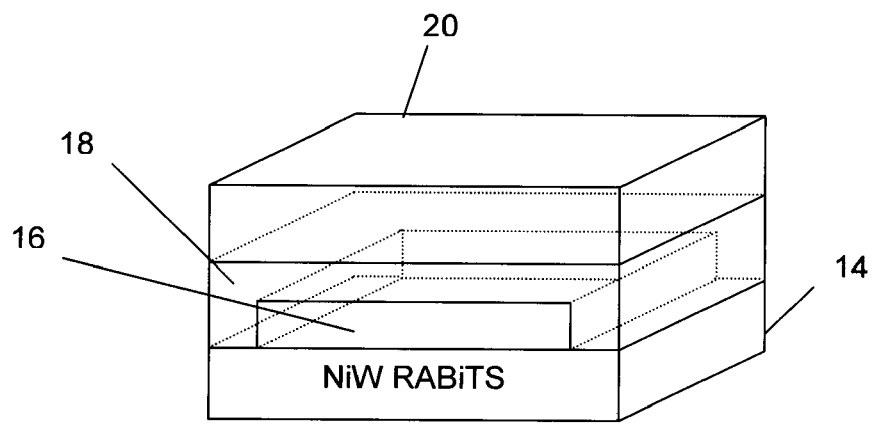
Figure 6F:
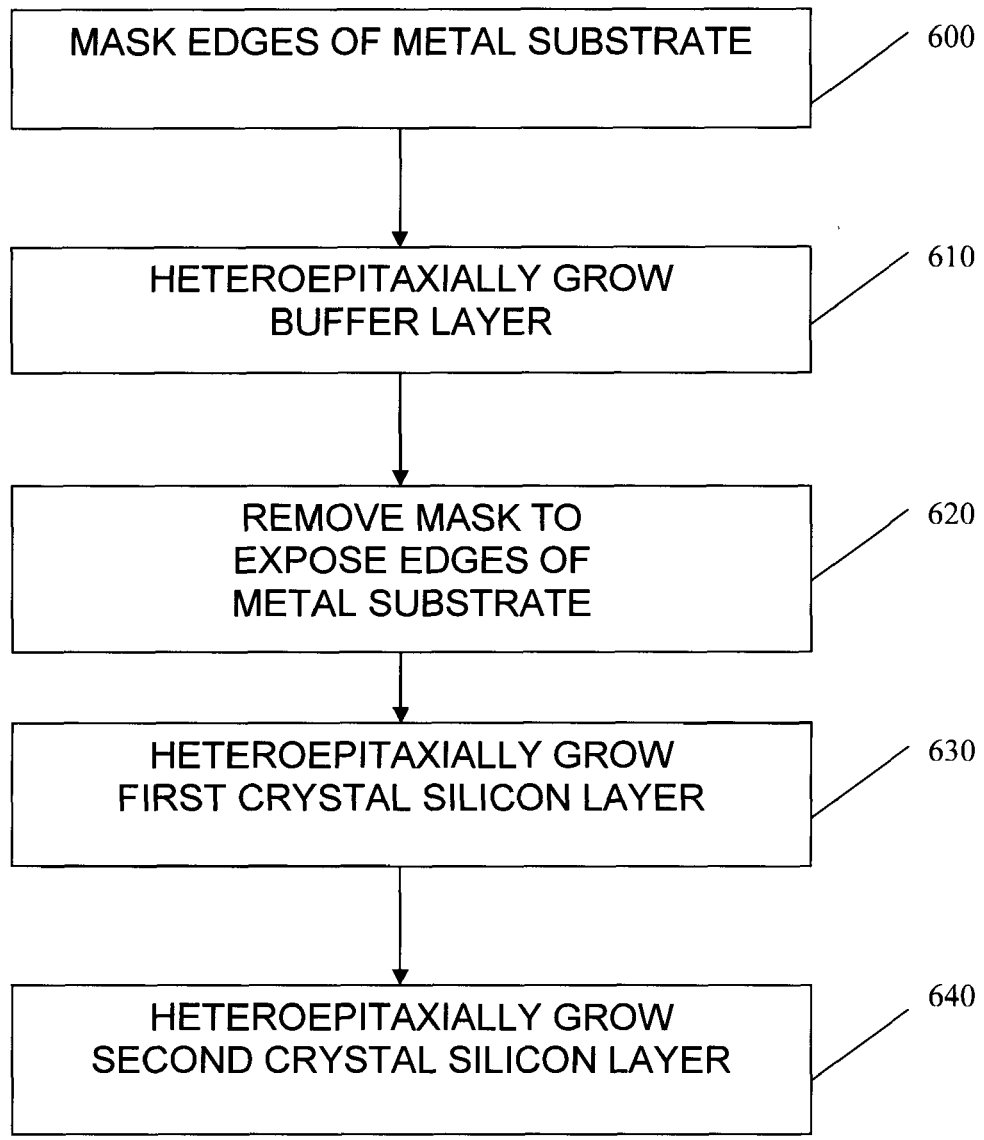
FIG. 6F is a flowchart illustrating a process related to the embodiment illustrated in FIGS. 6A-6E.

FIGS. 6A-6E and the flowchart of FIG. 6F illustrate an alternative process for creating electrically conductive pathways through a buffer layer to electrically couple the metal substrate 14 with the first heteroepitaxially grown crystal silicon layer 18. In particular, edges of the metal substrate 14 may be masked so that no buffer material forms over the edge of the metal substrate 14. Referring to FIG. 6A, a metal substrate 14 is shown with parallel polymer structures 70 lining its edges (operation 600, FIG. 6F). Similar to the previously described embodiment, the buffer layer 16 may be formed over the metal substrate 14 and the polymer structures 70, as shown in FIG. 6B (operation 610). The insulating buffer 16 is formed over the polymer structures 70, and the polymer structures 70 may be removed by chemical etching, solution coating or other process to leave the buffer layer 16, as illustrated in FIG. 6C (operation 620). The first crystal silicon layer 18 may be formed over the insulating buffer 16 and make contact with the metal substrate 14 where the polymer 70 was removed, thus, electrically coupling the crystal silicon layer 18 and the metal substrate 14, as illustrated in FIG. 6D (operation 630). Subsequently, additional crystal silicon layers 20 may be heteroepitaxially grown, as illustrated in FIG. 6E (operation 640).

In an alternative embodiment, the metal substrate 14 may be held (physically clamped) along its edges during growth of the buffer layer 16. The clamp acts as a mask such that no insulating buffer 16 is formed where the clamp engages the substrate. In such an alternative embodiment, the resulting buffer layer is similar to the buffer layer of FIG. 6C, as it has no buffer layer over the edges of the metal substrate 14.

Figure 7A:
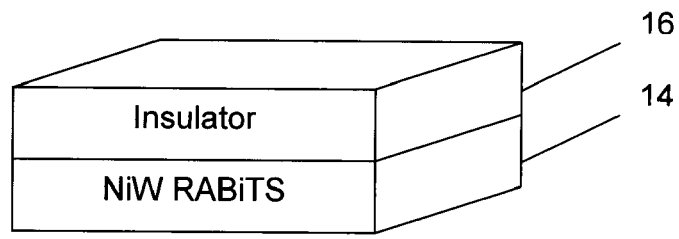
FIGS. 7A-7D illustrate successive representative isometric views of an embodiment for coupling the first crystal silicon layer with the metal substrate using a laser to drill through the buffer layer.
Figure 7B:
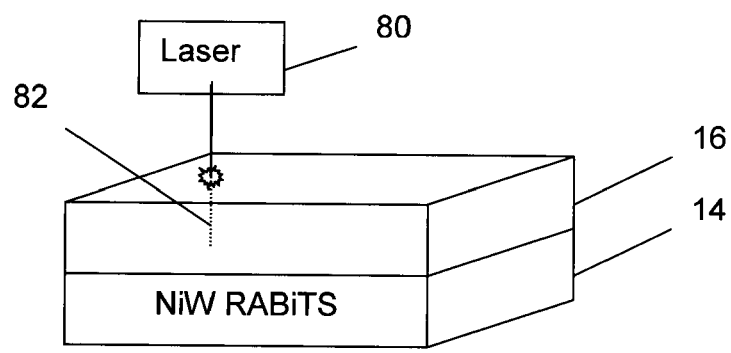
Figure 7C:
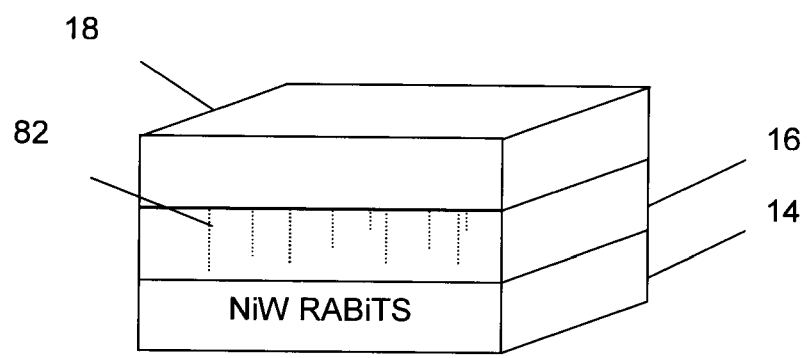
Figure 7D:
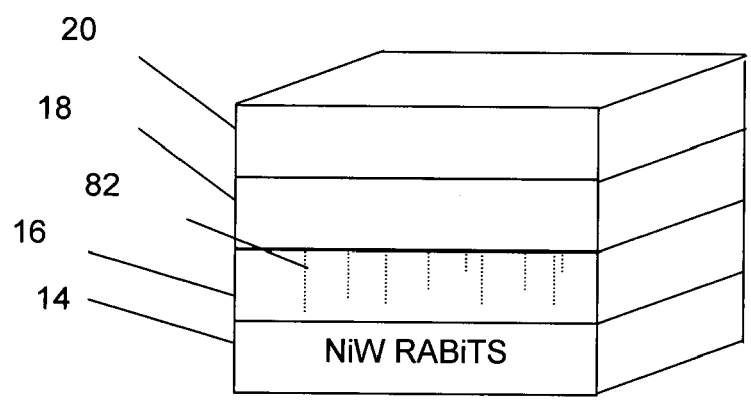
Figure 7E:
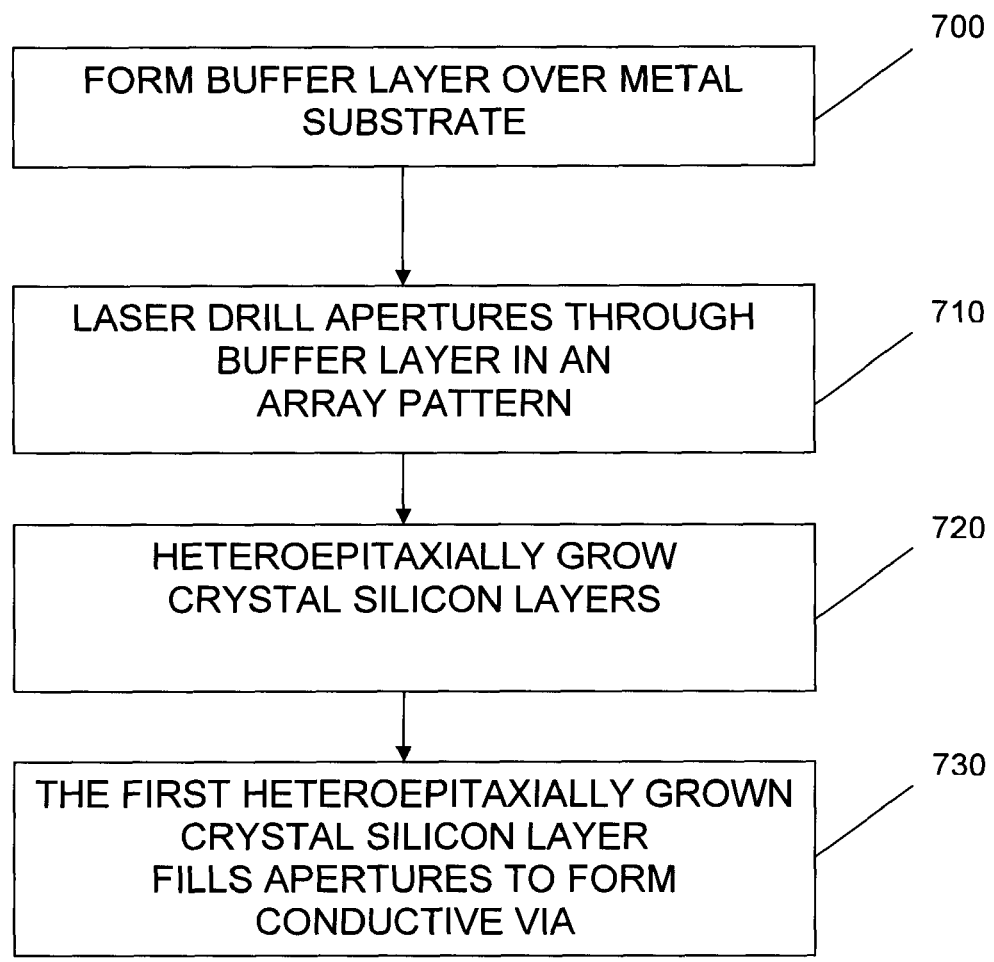
FIG. 7E is a flowchart illustrating a process related to the embodiment illustrated in FIGS. 7A-7D.

FIGS. 7A-7D and the process illustrated in FIG. 7E illustrate an embodiment where the buffer layer is provided over the NW substrate 14 without any form of removable structure. Rather, a laser or other process is used to create apertures in the buffer that expose the substrate 14. More particularly, the buffer layer 16 is formed over the metal substrate 14 before any other processing occurs, as illustrated in FIG. 7A (operation 700, FIG. 7E). Once the buffer layer 16 is grown, a laser 80 drills apertures 82 through the buffer layer 16, as shown in FIG. 7B (operation 710). The apertures 82 are drilled prior to heteroepitaxially growth of any crystal silicon over the buffer layer 16. As there is no concern of damaging crystal silicon by using the laser 80, the laser 80 may be any laser that operates at a wavelength and intensity sufficient to drill through the buffer layer 16.

The apertures 82 may be drilled in a grid pattern or other suitable pattern and at a distance from each other that provides low series resistance to the cell 10. The length of time it takes to drill each hole will vary depending on the type of laser used, the operating intensity of the laser, the buffer material and buffer thickness, among other things. However, because of the thinness of the buffer layer 16 (approximately 50-300 nm thick) it should not take much time. After the aperture pattern is created in the insulating buffer layer 16, a silicon layer 18 is heteroepitaxially grown on the buffer 16 (operation 720).

During drilling, a portion of the metal substrate 14 impacted briefly by the laser beam 84 may melt and fill or partially fill the aperture 82 in the buffer layer 16. Alternatively, or additionally, the first crystal silicon layer 18 may fill or partially fill the apertures 82 during the heteroepitaxial growth of the crystal silicon (operation 730). Thus, the crystal silicon layer 18 and the metal substrate 14 may be electrically coupled via the apertures 82 drilled by the laser 80.

Figure 8A:
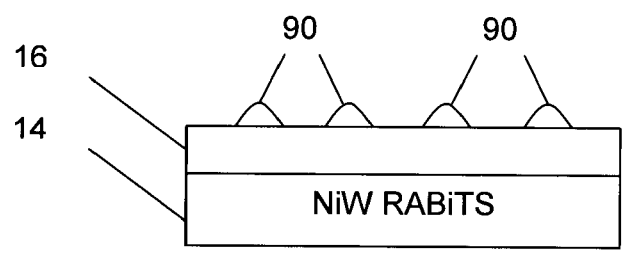
FIGS. 8A-8C illustrate successive representative section views of an embodiment for coupling the first crystal silicon layer with the metal substrate by applying an etchant to the buffer layer to form apertures through the buffer layer.

In an alternative embodiment, an etchant rather than a laser may be used to form apertures in the buffer layer 16, as shown in FIGS. 8A-8D. Specifically, the insulating buffer 16 may be formed over the metal substrate 14 (operation 800) and an etchant 90 may be applied to the buffer layer 16, as shown in FIG. 8A (operation 810). The etchant 90 may create apertures 92 through the buffer layer. The etchant 90 may be any etchant commonly used, such as acids, for example, and may be applied in a number of different ways. For example, the buffer layer 16 may be masked with a resin or polymer (not shown) so thin that holes form through which the etchant 90 may be applied. Alternatively, a sparse layer of nanoparticles (not shown) may be deposited by some method such as spin coating before the resin or polymer (not shown) so the resin or polymer will not adhere well to the metal substrate 14 and can be removed at the location of the nanoparticles by a chemical or mechanical or other means. By this means a set of holes can be produced in the resin or polymer through which an applied etchant can etch holes 92 into the buffer layer 16 of the resin or polymer. Alternatively, the etchant 90 may be applied using an inkjet cartridge or by spraying a fine mist of the etchant 90 on the buffer layer 16, for example. Using the inkjet cartridge may allow for precise placement of the etchant 90 on the buffer layer 16 such that a grid or array may be formed by the etchant. In contrast, the spraying of a fine mist may result in random placement of the etchant 90 on the surface of the buffer layer 16.

Figure 8B:
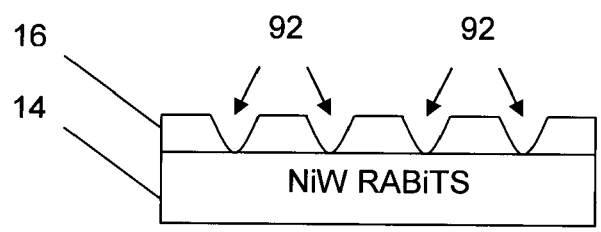
Figure 8C:
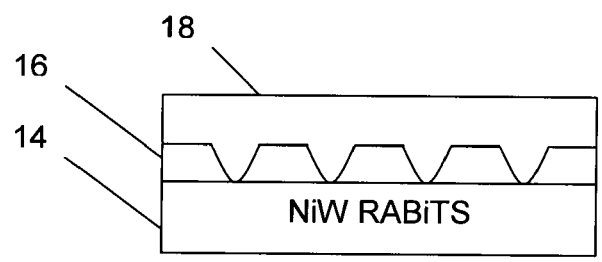
Figure 8D:
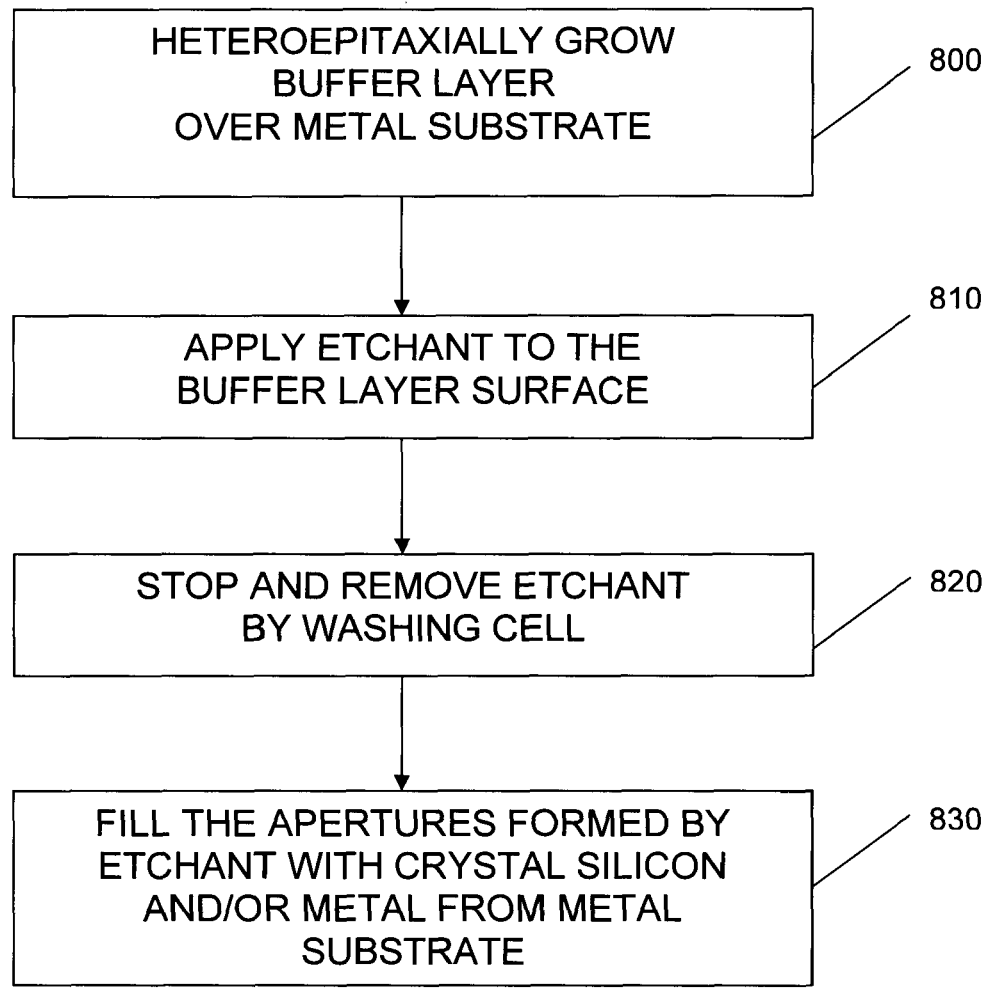
FIG. 8D is a flowchart illustrating a process related to the embodiment illustrated by FIGS. 8A-8C.

Once the etchant 90 has been applied, etching may be stopped by washing with water or other chemical, leaving apertures 92 through the buffer layer 16, as shown in FIG. 8B (operation 820). The first crystal silicon layer 18 may then be formed over the buffer layer 16 and may fill the apertures 92, as shown in FIG. 8C, so that the first crystal silicon layer 18 makes contact with the underlying metal substrate 18 (operation 830). In some embodiments, the apertures 92 may be filled with an alloy of silicon and the metal from the metal substrate. In the case of a NiW substrate, the apertures 92 may be at least partially filled with nickel silicide (NiSix).

Figure 9A:
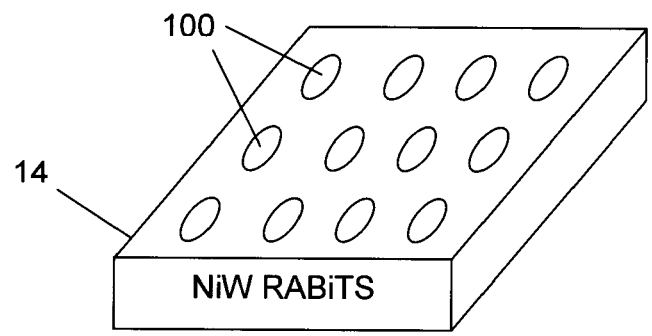
FIGS. 9A-9C illustrate successive representative isometric views of an embodiment for coupling the first crystal silicon layer with the metal substrate by applying nanoparticles to the metal substrate, growing the buffer layer over the nanoparticles and removing the nanoparticles to leave apertures in the buffer layer, with FIG. 9D being a representative section view of FIG. 9C.
Figure 9B:
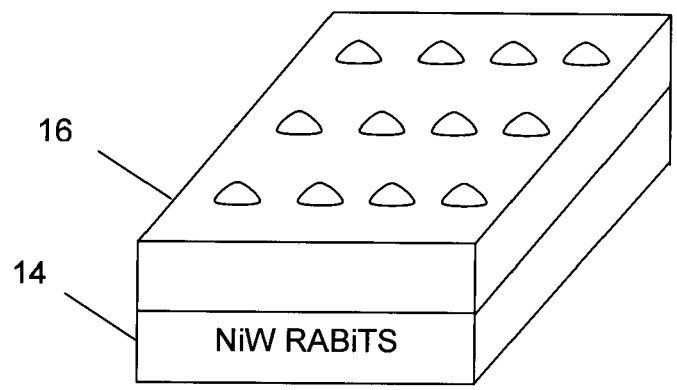
Figure 9C:
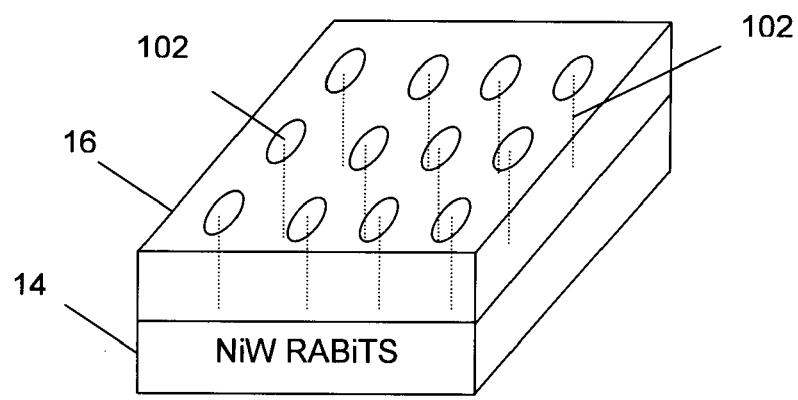
Figure 9D:
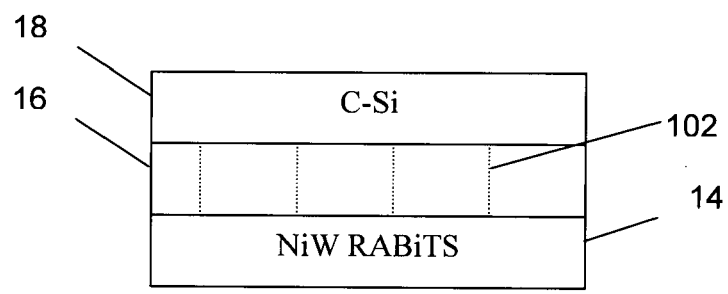
FIG. 9E is a flowchart illustrating a process related to the embodiment illustrated in FIGS. 9A-9D.
Figure 9E:
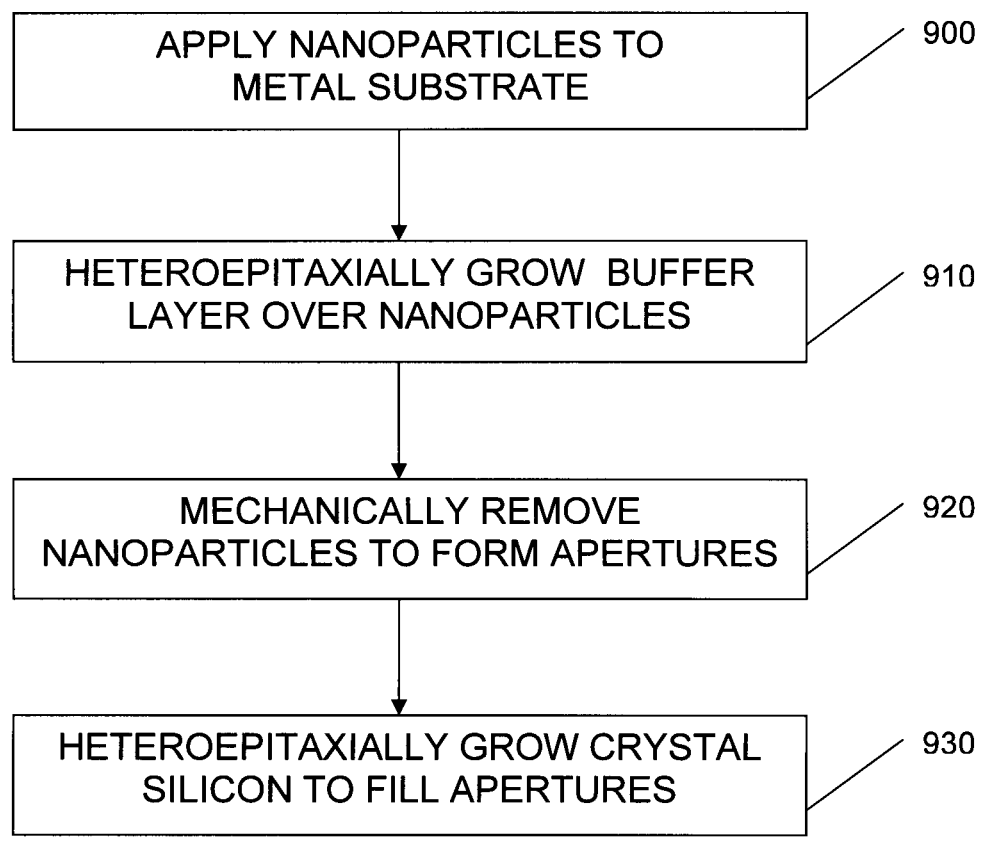

FIGS. 9A-9D and the flowchart of FIG. 9E illustrate yet another alternative process for electrically coupling the crystal silicon layer with the metal substrate. As shown in FIG. 9A, nanoparticles 100 may be applied to the surface of the metal substrate 14 (operation 900, FIG. 9D). The nanoparticles 100 may be any suitable material possibly including, but not limited to titanium dioxide ($TiO_2$) and silicon dioxide ($SiO_2$), for example, and may be spun onto the metal substrate 14 in accordance with known techniques to have a desired spacing to achieve an acceptably low lateral resistivity for the cell 10, as discussed above. FIG. 9B shows the buffer layer 16 grown on top of the metal substrate 14 and the nanoparticles 100 (operation 910). A mechanical abrasion process or other suitable process may then remove the nanoparticles 100, leaving apertures 102 in the buffer layer 12, as shown in FIG. 9C (operation 920). Crystal silicon 18 may then be grown on top of the buffer layer 16 and may fill the apertures 102 left by the nanoparticles 100 to electrically couple to the metal substrate 14 with the first crystal silicon layer 18 (operation 930).

In yet another alternative embodiment droplets of material may be applied to the metal substrate 14 to which the buffer layer 16 will not adhere or, alternatively, droplets that weaken the buffer layer 16 may be applied. For example, FIG. 10A shows the droplets 110 on top of the metal substrate 14 (operation 1000, FIG. 10E). The buffer layer 16 may then be grown over the droplets 110, as shown in FIG. 10B (operation 1010). Subsequently, apertures 112 may be made by chemically washing the buffer layer to remove portions of the buffer layer 16 formed over the droplets 110, as shown in FIGS. 10C and 10D (operation 1020). Similar to other embodiments, heteroepitaxial growth of the crystal silicon layer 18 fills the apertures 112 and, hence, the metal substrate 14 and the crystal silicon layer 18 may be electrically coupled (operation 1030).

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A photovoltaic device comprising:
a metal substrate with a crystal orientation;
a heteroepitaxial crystal semiconductor layer having the crystal orientation of the metal substrate; and
an insulating heteroepitaxial buffer layer having the crystal orientation of the metal substrate, the buffer layer positioned between the substrate and the crystal semiconductor layer, the buffer layer reducing diffusion of metal from the metal substrate into the crystal semiconductor layer and providing chemical compatibility with the heteroepitaxial crystal semiconductor layer, wherein the buffer layer comprises one or more electrically conductive pathways to electrically couple the crystal silicon layer and the metal substrate.

2. The photovoltaic device of claim 1 wherein:
the metal substrate comprises a nickel tungsten foil textured by a rolling-assisted process, the crystal orientation being a biaxial orientation;
the heteroepitaxial crystal semiconductor layer comprises a heteroepitaxial silicon layer; and
the buffer layer comprises sublayers of magnesium oxide and aluminum oxide.

3. The photovoltaic device of claim 2 wherein the crystal silicon layer comprises a first doped crystal silicon layer adjacent to the buffer layer and a second doped crystal silicon layer, the second doped silicon layer being doped with a lower concentration of dopant relative to the first doped crystal silicon layer.

4. The photovoltaic cell of claim 1 wherein the crystal orientation of the metal substrate is uniaxially or biaxially textured.

5. The photovoltaic cell of claim 2 wherein:
the metal substrate is between 20 and 100 micrometers thick;
the buffer layer is between 20 and 300 nanometers thick; and
the crystal silicon layer is between 2 and 20 micrometers thick.

6. The photovoltaic cell of claim 1 wherein the one or more electrically conductive pathways comprises a plurality of conductive pathways arranged in a grid pattern with substantially uniform separation between each of the plurality of conductive pathways.

7. The photovoltaic cell of claim 1 wherein the one or more electrically conductive pathways are positioned uniformly approximately one centimeter apart.

8. The photovoltaic cell of claim 1 wherein the one or more electrically conductive pathways are formed by causing localized metal diffusion through the buffer.

9. The photovoltaic cell of claim 1 wherein the one or more electrically conductive pathways are formed using an etchant to form apertures in the buffer layer and filling the apertures with conductive material.

10. A photovoltaic cell comprising:
- a back contact comprising a nickel tungsten foil substrate textured by a rolling-assisted process to have a crystal orientation;
- a doped first crystal silicon layer heteroepitaxially grown and having the same crystal orientation as the nickel tungsten foil substrate, the first crystal silicon layer is phosphorus doped;
- a second doped crystal silicon layer, the second crystal silicon layer being less doped than the first crystal silicon layer; and
- a heteroepitaxially grown buffer layer positioned between the doped first crystal silicon layer and the nickel tungsten foil substrate, the buffer having the same crystal orientation as the doped first crystal silicon and the nickel tungsten foil substrate, wherein the buffer layer comprises at least one conductive pathway electrically coupling the back contact and the first crystal silicon layer.

11. The photovoltaic cell of claim 10 wherein the at least one conductive pathway comprises one or more of crystal silicon of the first crystal silicon layer, metal from back contact diffusion, and metallic paste.

12. A method of electrically coupling a crystal oriented metal substrate of a photovoltaic cell with an absorber layer of the photovoltaic cell comprising creating a conductive pathway in a heteroepitaxially grown buffer layer positioned between the crystal oriented metal substrate and the absorber layer, wherein the conductive pathway is formed by intermixing metal from the metal substrate through the buffer layer using an infrared laser, wherein both the buffer layer and the absorber layer have the same crystal orientation of the metal substrate.

13. A photovoltaic device comprising:
- a metal substrate with a crystal orientation;
- a heteroepitaxial crystal silicon layer having the crystal orientation of the metal substrate; and
- an insulating heteroepitaxial buffer layer having the crystal orientation of the metal substrate, the buffer layer positioned between the substrate and the crystal silicon layer, the buffer layer reducing diffusion of metal from the metal substrate into the crystal silicon layer and providing chemical compatibility with the heteroepitaxial crystal silicon layer, wherein the buffer layer comprises one or more electrically conductive pathways to electrically couple the crystal silicon layer and the metal substrate.

* * * * *